US012757435B2

(12) United States Patent
Hamazawa

(10) Patent No.: US 12,757,435 B2
(45) Date of Patent: Oct. 6, 2026

(54) SEMICONDUCTOR DEVICE

(71) Applicant: ROHM CO., LTD., Kyoto (JP)

(72) Inventor: Yasushi Hamazawa, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 598 days.

(21) Appl. No.: 18/031,015

(22) PCT Filed: Oct. 25, 2021

(86) PCT No.: PCT/JP2021/039336
§ 371 (c)(1),
(2) Date: Apr. 10, 2023

(87) PCT Pub. No.: WO2022/092035
PCT Pub. Date: May 5, 2022

(65) Prior Publication Data

US 2023/0378345 A1 Nov. 23, 2023

(30) Foreign Application Priority Data

Oct. 29, 2020 (JP) ................................ 2020-181367

(51) Int. Cl.
*H10D 30/65* (2025.01)
*H10D 62/17* (2025.01)
(Continued)

(52) U.S. Cl.
CPC ........... *H10D 30/65* (2025.01); *H10D 62/235* (2025.01); *H10D 62/351* (2025.01); *H10D 64/519* (2025.01); *H10D 64/112* (2025.01)

(58) Field of Classification Search
CPC ........... H10D 30/601-608; H10D 64/111-117; H10D 62/393; H10D 30/603;
(Continued)

(56) References Cited

U.S. PATENT DOCUMENTS 4,922,327 A * 5/1990 Mena ..................... H10D 30/65 257/E29.256
4,990,982 A * 2/1991 Omoto ................. H10D 64/516 257/E29.268
(Continued)

FOREIGN PATENT DOCUMENTS

JP 2015-216218 A 12/2015
JP 2019-165094 A 9/2019

OTHER PUBLICATIONS

International Search Report and Written Opinion mailed on Jan. 11, 2022, received for PCT Application PCT/JP2021/039336, filed on Oct. 25, 2021, 12 pages including English Translation.
(Continued)

*Primary Examiner* — Maliheh Malek
(74) *Attorney, Agent, or Firm* — XSENSUS LLP

(57) ABSTRACT

A semiconductor device includes a chip, a drain region, a source region formed at the surface layer portion of the main surface at a distance from the drain region, a channel inversion region formed on a side of the source region between the drain region and the source region in the surface layer portion of the main surface, a drift region formed in a region between the drain region and the channel inversion region in the surface layer portion of the main surface, a gate insulating film having a first portion that covers the channel inversion region on the main surface and a second portion that covers the drift region on the main surface, and a gate electrode having a first electrode portion covering the first portion and a second electrode portion led out from the first electrode portion onto second portion so as to partially expose second portion.

20 Claims, 15 Drawing Sheets

(51) Int. Cl.
*H10D 64/27* (2025.01)
*H10D 64/00* (2025.01)

(58) Field of Classification Search
CPC .. H10D 30/668; H10D 62/154; H10D 62/158; H10D 30/0221; H10D 30/0297; H10D 64/513; H10D 84/038; H10D 64/112; H10D 30/0281; H10D 30/66; H10D 62/116; H10D 64/516
See application file for complete search history.

(56) References Cited

U.S. PATENT DOCUMENTS

| | | | | |
|---|---|---|---|---|
| 5,059,547 A * | 10/1991 | Shirai | H10D 30/657 | 257/E21.32 |
| 5,072,268 A * | 12/1991 | Rumennik | H10D 12/411 | 257/567 |
| 5,162,883 A * | 11/1992 | Fujihira | H10D 30/603 | 257/E29.066 |
| 5,346,835 A * | 9/1994 | Malhi | H10D 30/603 | 257/E27.06 |
| 5,378,912 A * | 1/1995 | Pein | H10D 30/657 | 257/E29.279 |
| 5,521,105 A * | 5/1996 | Hsu | H10D 62/151 | 257/E29.268 |
| 5,710,455 A * | 1/1998 | Bhatnagar | H10D 64/112 | 257/493 |
| 5,777,363 A * | 7/1998 | Malhi | E05B 47/00 | 257/E29.081 |
| 5,969,387 A * | 10/1999 | Letavic | H10D 30/657 | 257/E29.279 |
| 6,025,237 A * | 2/2000 | Choi | H10D 30/0281 | 257/342 |
| 6,063,674 A * | 5/2000 | Yang | H10D 62/151 | 438/297 |
| 6,160,290 A * | 12/2000 | Pendharkar | H10D 30/603 | 257/493 |
| 6,177,321 B1 * | 1/2001 | Oh | H10D 62/151 | 257/E29.268 |
| 6,221,737 B1 * | 4/2001 | Letavic | H10D 30/0323 | 257/E21.258 |
| 6,232,636 B1 * | 5/2001 | Simpson | H10D 30/0323 | 257/E29.279 |
| 6,424,005 B1 * | 7/2002 | Tsai | H10D 30/65 | 257/283 |
| 6,448,611 B1 * | 9/2002 | Oh | H10D 64/111 | 257/341 |
| 6,448,625 B1 * | 9/2002 | Hossain | H10D 30/0221 | 257/493 |
| 6,531,355 B2 * | 3/2003 | Mosher | H10D 30/0221 | 257/E29.268 |
| 6,555,883 B1 * | 4/2003 | Disney | H10D 30/603 | 257/E29.12 |
| 6,639,277 B2 * | 10/2003 | Rumennik | H10D 62/152 | 257/E29.256 |
| 6,762,457 B2 * | 7/2004 | Pearce | H10D 30/65 | 257/E21.258 |
| 6,773,997 B2 * | 8/2004 | Imam | H10D 62/151 | 257/E29.268 |
| 6,787,437 B2 * | 9/2004 | Rumennik | H10D 30/65 | 257/E29.256 |
| 7,489,007 B2 * | 2/2009 | Williams | H10D 62/151 | 257/335 |
| 7,705,399 B2 * | 4/2010 | Tanaka | H10D 30/603 | 257/341 |
| 8,154,078 B2 * | 4/2012 | Chang | H10D 30/0221 | 257/341 |
| 9,293,569 B2 * | 3/2016 | Toner | H10D 10/056 | |
| 9,373,619 B2 * | 6/2016 | Su | H10D 62/114 | |
| 9,997,626 B2 * | 6/2018 | Duan | H10D 30/603 | |
| 10,497,787 B2 * | 12/2019 | Edwards | H10D 64/111 | |
| 10,510,831 B2 * | 12/2019 | Mun | H10D 62/393 | |
| 11,309,406 B2 * | 4/2022 | He | H10D 30/0287 | |
| 2001/0031533 A1 * | 10/2001 | Nishibe | H10D 30/028 | 257/E29.066 |
| 2002/0125530 A1 * | 9/2002 | Imam | H10D 30/603 | 257/E29.268 |
| 2003/0027396 A1 * | 2/2003 | Imam | H10D 62/151 | 438/528 |
| 2004/0108549 A1 * | 6/2004 | Denison | H10D 30/65 | 257/E29.066 |
| 2004/0251498 A1 * | 12/2004 | Zingg | H10D 12/421 | 257/343 |
| 2006/0175670 A1 * | 8/2006 | Tsubaki | H10D 64/111 | 257/E21.252 |
| 2007/0096205 A1 * | 5/2007 | Ko | H10D 30/603 | 257/E29.264 |
| 2007/0181943 A1 * | 8/2007 | Pfirsch | H10D 30/0289 | 257/E29.022 |
| 2007/0215949 A1 * | 9/2007 | Kijima | H10D 84/856 | 257/E27.06 |
| 2009/0256199 A1 * | 10/2009 | Denison | H10D 64/111 | 257/E21.409 |
| 2013/0020632 A1 * | 1/2013 | Disney | H10D 62/151 | 257/E21.409 |
| 2013/0341714 A1 * | 12/2013 | Jang | H10D 30/65 | 257/335 |
| 2014/0264587 A1 * | 9/2014 | Moon | H10D 30/0285 | 438/286 |
| 2015/0325693 A1 * | 11/2015 | Mori | H10D 30/603 | 257/339 |
| 2016/0172486 A1 * | 6/2016 | Kim | H10D 30/65 | 257/339 |
| 2016/0181369 A1 * | 6/2016 | Ning | H10D 30/83 | 438/194 |
| 2016/0351704 A1 * | 12/2016 | Duan | H10D 30/0221 | |
| 2017/0194489 A1 * | 7/2017 | Park | H10D 30/655 | |
| 2018/0342609 A1 * | 11/2018 | Qi | H10D 30/65 | |
| 2019/0259829 A1 * | 8/2019 | Mun | H10D 64/258 | |
| 2020/0043801 A1 * | 2/2020 | Kim | H10D 84/038 | |
| 2021/0119041 A1 * | 4/2021 | Ma | H10D 30/603 | |
| 2021/0175349 A1 * | 6/2021 | Cai | H10D 30/0512 | |
| 2022/0005948 A1 * | 1/2022 | Chuang | H10D 30/0281 | |
| 2022/0302291 A1 * | 9/2022 | Guo | H10D 30/47 | |
| 2023/0081508 A1 * | 3/2023 | Tu | H10D 30/0221 | 257/288 |
| 2023/0100115 A1 * | 3/2023 | Imam | H10D 64/01 | 257/288 |
| 2023/0154994 A1 * | 5/2023 | Shimatou | H10D 64/516 | 257/329 |
| 2023/0155025 A1 * | 5/2023 | Wada | H10D 30/603 | 257/335 |
| 2023/0238435 A1 * | 7/2023 | Cheng | H10D 64/111 | 257/213 |
| 2023/0307539 A1 * | 9/2023 | Singh | H10D 30/603 | |
| 2024/0128373 A1 * | 4/2024 | Shimizu | H10D 84/038 | |
| 2024/0258426 A1 * | 8/2024 | Jung | H10D 30/65 | |
| 2024/0332375 A1 * | 10/2024 | Lee | H10D 62/102 | |
| 2024/0363720 A1 * | 10/2024 | Edwards | H10D 62/116 | |

OTHER PUBLICATIONS

Notice of Reasons for Refusal dated Aug. 21, 2025 issued in corresponding Japanese patent application No. 2022-559130 (6 pages; with English machine translation).

* cited by examiner

SEMICONDUCTOR DEVICE

CROSS-REFERENCE TO RELATED APPLICATIONS

The present application is based on PCT filing PCT/JP2021/039336, filed Oct. 25, 2021, which claims priority to Japanese Patent Application No. 2020-181367, filed Oct. 29, 2020, the entire disclosure of each is incorporated herein by reference.

TECHNICAL FIELD

The present invention relates to a semiconductor device.

BACKGROUND ART

Patent Literature 1 discloses a semiconductor device including a p-substrate, a p-well, an n-type low concentration diffusion layer, a source, a drain, a gate insulating film, and a gate electrode. The p-well is formed in the p-substrate. The n-type low concentration diffusion layer is formed in the p-well. The source is formed in the p-well at a distance from the n-type low concentration diffusion layer. The drain is formed in the n-type low concentration diffusion layer at a distance from the source. The gate insulating film covers a channel region between the source and the drain. The gate electrode is formed in the gate insulating film.

CITATION LIST

Patent Literature

Patent Literature 1: US Patent Application Publication No. 2007/215949

SUMMARY OF INVENTION

Technical Problem

An embodiment of the present invention provides a semiconductor device that is capable of improving electrical properties.

Solution to Problem

An embodiment of the present invention provides a semiconductor device including a chip having a main surface, a drain region formed at a surface layer portion of the main surface, a source region formed at the surface layer portion of the main surface at a distance from the drain region, a channel inversion region formed on a side of the source region between the drain region and the source region in the surface layer portion of the main surface, a drift region formed in a region between the drain region and the channel inversion region in the surface layer portion of the main surface, a gate insulating film having a first portion that covers the channel inversion region on the main surface and a second portion that covers the drift region on the main surface, and a gate electrode having a first electrode portion covering the first portion and a second electrode portion led out from the first electrode portion onto the second portion so as to partially expose the second portion.

The aforementioned or still other objects, features, and effects of the present invention will be clarified by the following description of embodiments given below with reference to the accompanying drawings.

DESCRIPTION OF EMBODIMENTS

Figure 1:
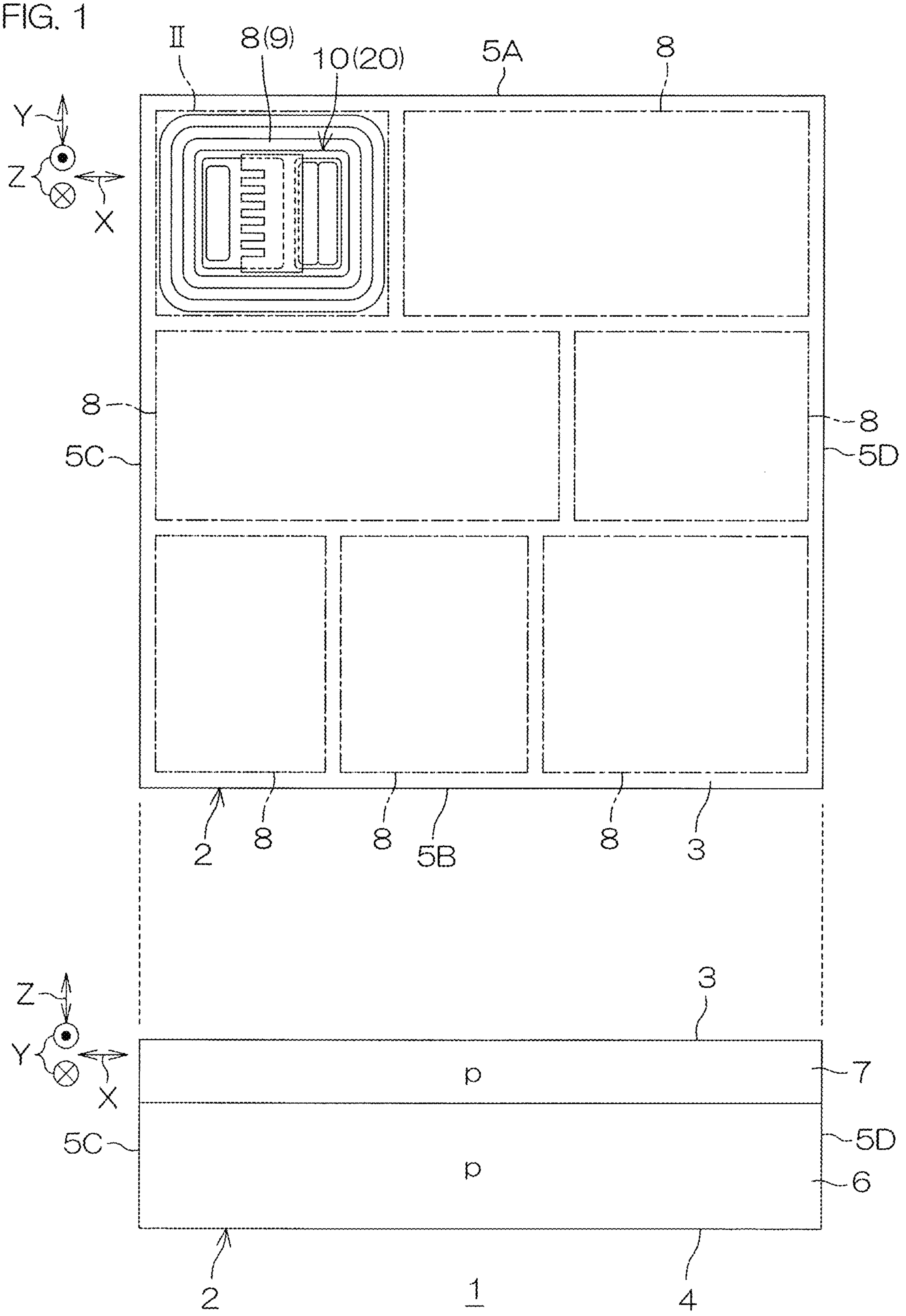
FIG. 1 is a schematic view showing a semiconductor device according to a first embodiment of the present invention.

FIG. 1 is a schematic view showing a semiconductor device 1 according to a first embodiment of the present invention. Referring to FIG. 1, the semiconductor device 1 includes a semiconductor chip 2 (chip) formed in a rectangular parallelepiped shape. The semiconductor chip 2 is constituted of a silicon chip in this embodiment. The semiconductor chip 2 has a first main surface 3 on one side, a second main surface 4 on the other side, and first to fourth side surfaces 5A to 5D that connect the first main surface 3 and the second main surface 4.

The first main surface 3 and the second main surface 4 are each formed in a quadrangular shape in a plan view when seen from their normal directions Z. The normal direction Z is also a thickness direction of the semiconductor chip 2. The first side surface 5A and the second side surface 5B extend in a first direction X along the first main surface 3, and face a second direction Y that intersects (in detail, orthogonally intersects) the first direction X. The third side surface 5C and the fourth side surface 5D extend in the second direction Y, and face the first direction X.

The semiconductor device 1 includes a p-type (first conductivity type) first semiconductor region 6 formed in a surface layer portion of the second main surface 4 of the semiconductor chip 2. The first semiconductor region 6 is formed in a whole area of the surface layer portion of the second main surface 4, and is exposed from the second main surface 4 and from the first to fourth side surfaces 5A to 5D. In other words, the first semiconductor region 6 has the second main surface 4 and a part of the first to fourth side surfaces 5A to 5D.

The first semiconductor region 6 may have a p-type impurity concentration substantially constant in the thickness direction. The p-type impurity concentration of the first semiconductor region 6 may be not less than $1\times10^{14}$ cm$^{-3}$ and not more than $5\times10^{15}$ cm$^{-3}$. The thickness of the first semiconductor region 6 may be not less than 50 μm and not more than 800 μm. The thickness of the first semiconductor region 6 is adjusted by grinding the second main surface 4. In this embodiment, the first semiconductor region 6 is formed by a p-type semiconductor substrate.

The semiconductor device 1 includes a p-type second semiconductor region 7 (semiconductor region) formed in a surface layer portion of the first main surface 3 of the semiconductor chip 2. The second semiconductor region 7 is formed in a whole area of the surface layer portion of the first main surface 3, and is exposed from the first main surface 3 and from the first to fourth side surfaces 5A to 5D. In other words, the second semiconductor region 7 has the first main surface 3 and a part of the first to fourth side surfaces 5A to 5D. The p-type impurity concentration of the second semiconductor region 7 may be not less than $1\text{-}10^{14}$ cm$^{-3}$ and not more than $5\times10^{55}$ cm$^{-3}$. The thickness of the second semiconductor region 7 may be not less than 5 μm and not more than 20 μm. In this embodiment, the second semiconductor region 7 is formed by a p-type epitaxial layer.

The semiconductor device 1 includes a plurality of device regions 8 provided in the second semiconductor region 7. The device regions 8 are regions in which various function devices are respectively formed. The device regions 8 are respectively demarcated in an inward portion of the first main surface 3 at a distance from the first to fourth side surfaces 5A to 5D in a plan view. The number, the disposition, and the shape of the device regions 8 are arbitrary, and are not limited to a specific number, a specific disposition, and a specific shape. The function devices may each include at least one among a semiconductor switching device, a semiconductor rectifying device, and a passive device.

The semiconductor switching device may include at least one among JFET (Junction Field Effect Transistor: junction type transistor), MISFET (Metal Insulator Semiconductor Field Effect Transistor), BJT (Bipolar Junction Transistor: bipolar transistor), and IGBT (Insulated Gate Bipolar Junction Transistor: insulated gate type bipolar transistor). The semiconductor rectifying device may include at least one among a pn junction diode, a pin junction diode, a Zener diode, a Schottky barrier diode, and a fast recovery diode. The passive device may include at least one among a resistor, a capacitor, an inductor, and a fuse.

In this embodiment, the device regions 8 include at least one MISFET region 9. The MISFET region 9 is a region including a planar gate structure type MISFET 10. A detailed structure on the MISFET region 9 side (MISFET 10 side) will be hereinafter described.

Figure 2:
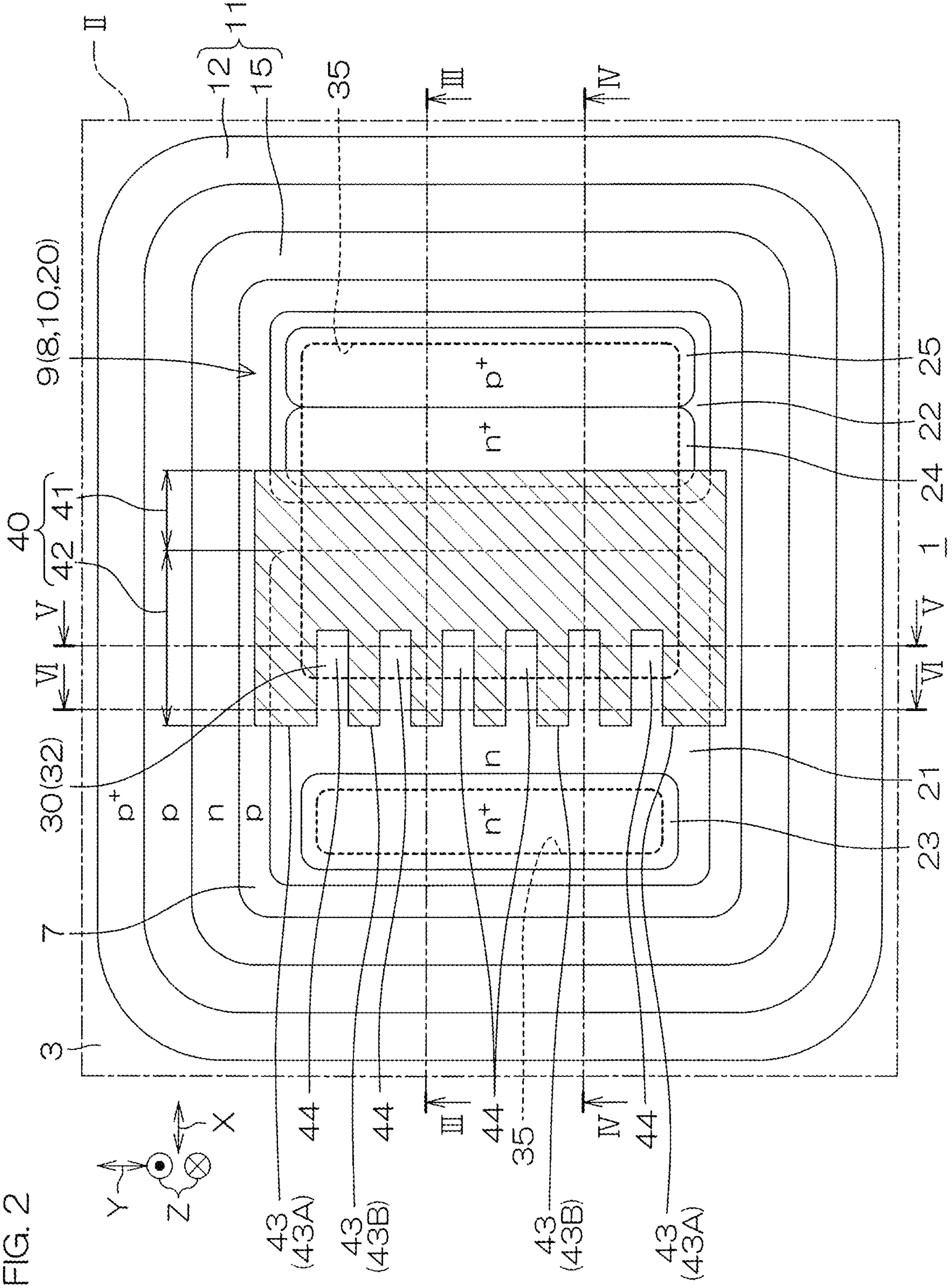
FIG. 2 is an enlarged view showing region II shown in FIG. 1 together with a gate electrode according to a first mode example.
Figure 3:
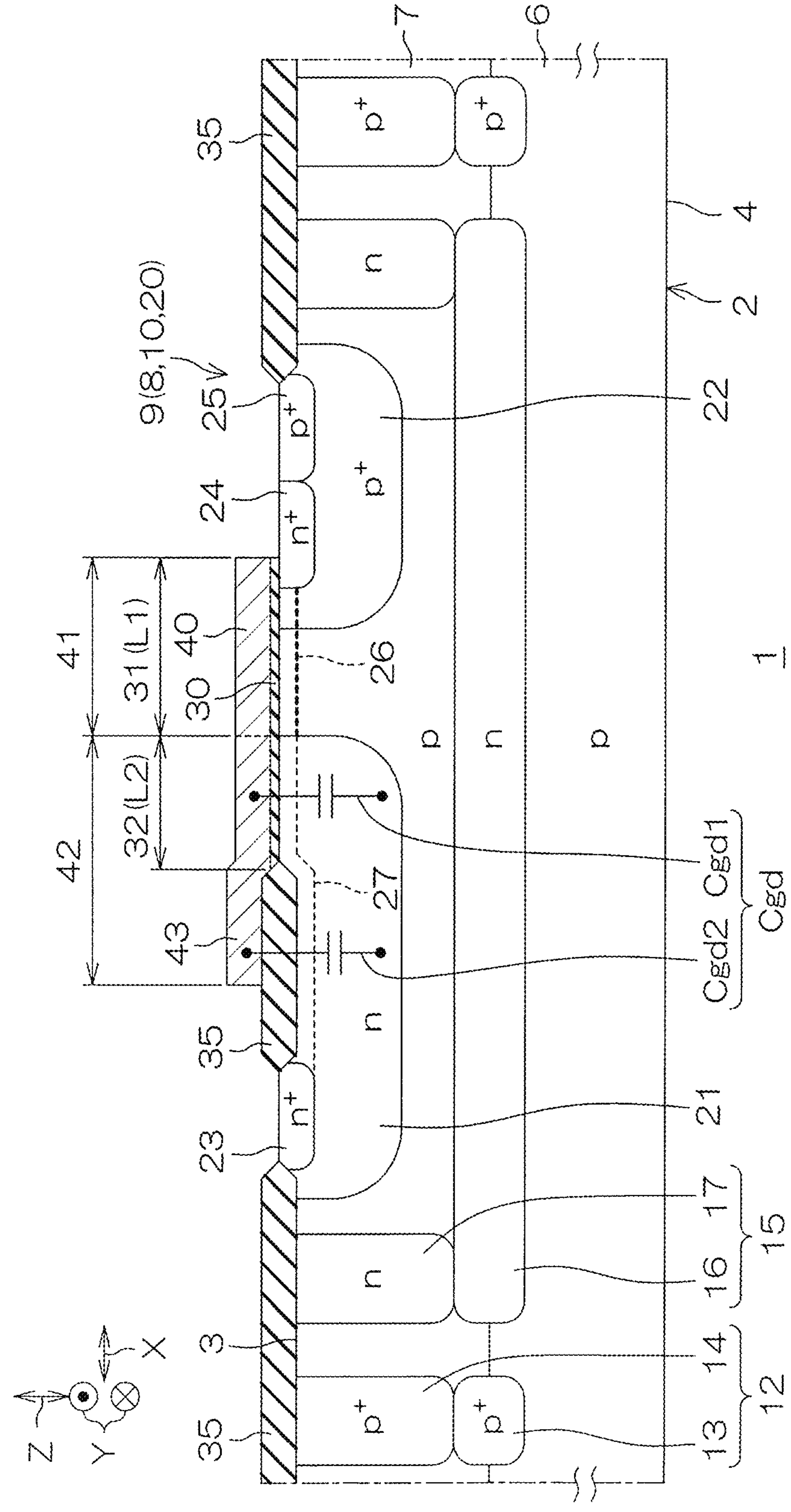
FIG. 3 is a cross-sectional view along line III-III shown in FIG. 2.
Figure 4:
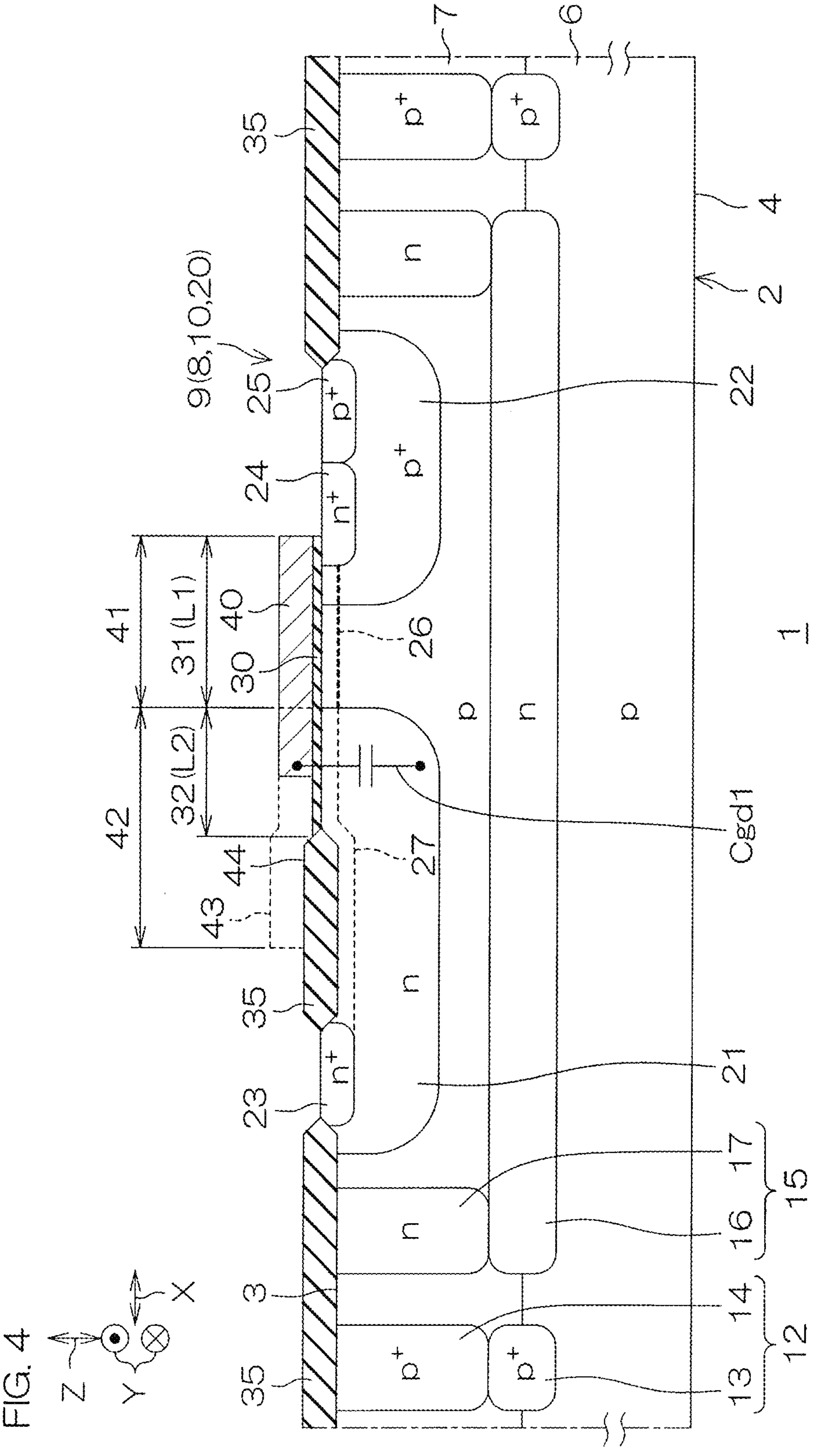
FIG. 4 is a cross-sectional view along line IV-IV shown in FIG. 2.
Figure 5:
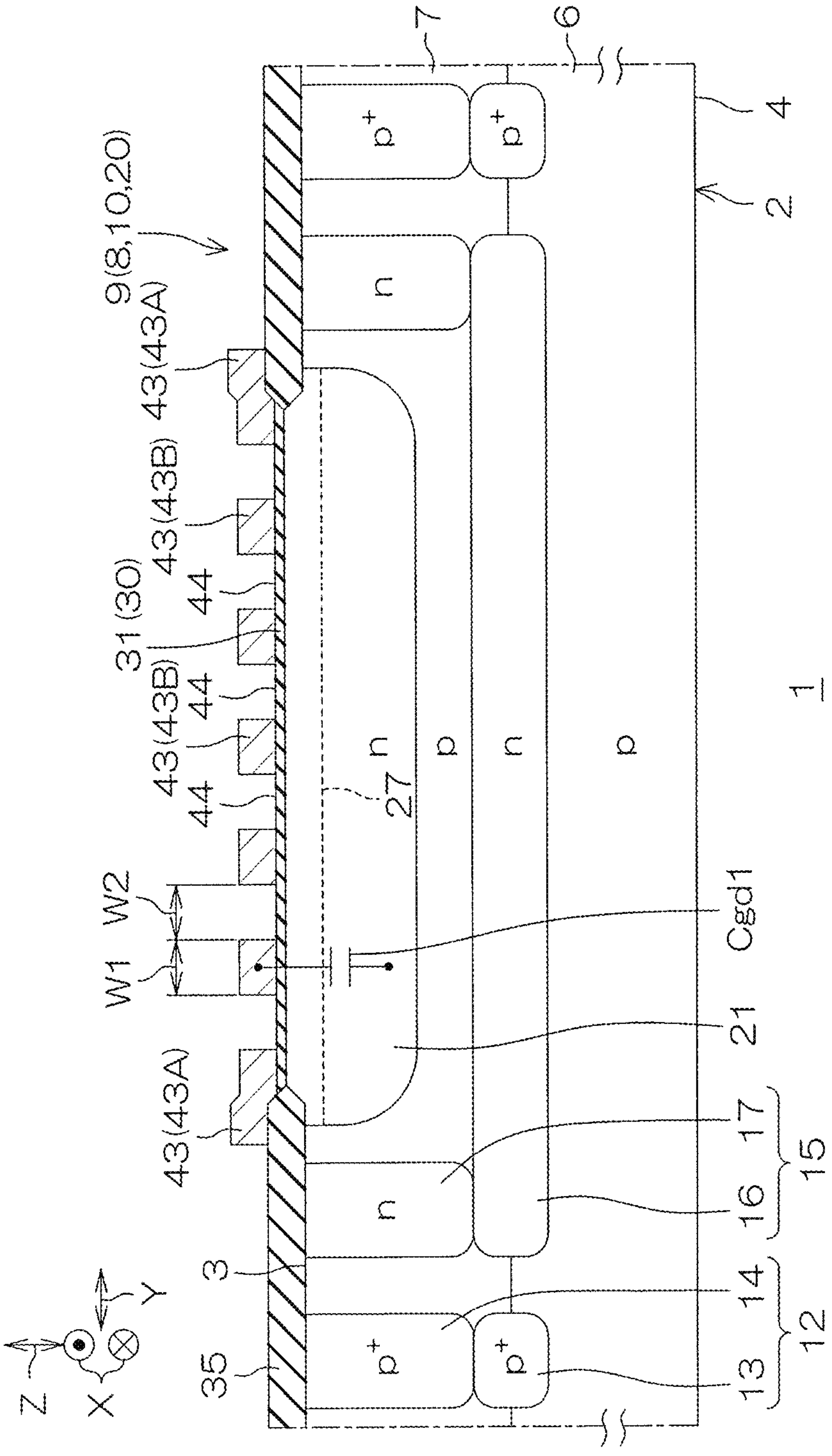
FIG. 5 is a cross-sectional view along line V-V shown in FIG. 2.
Figure 6:
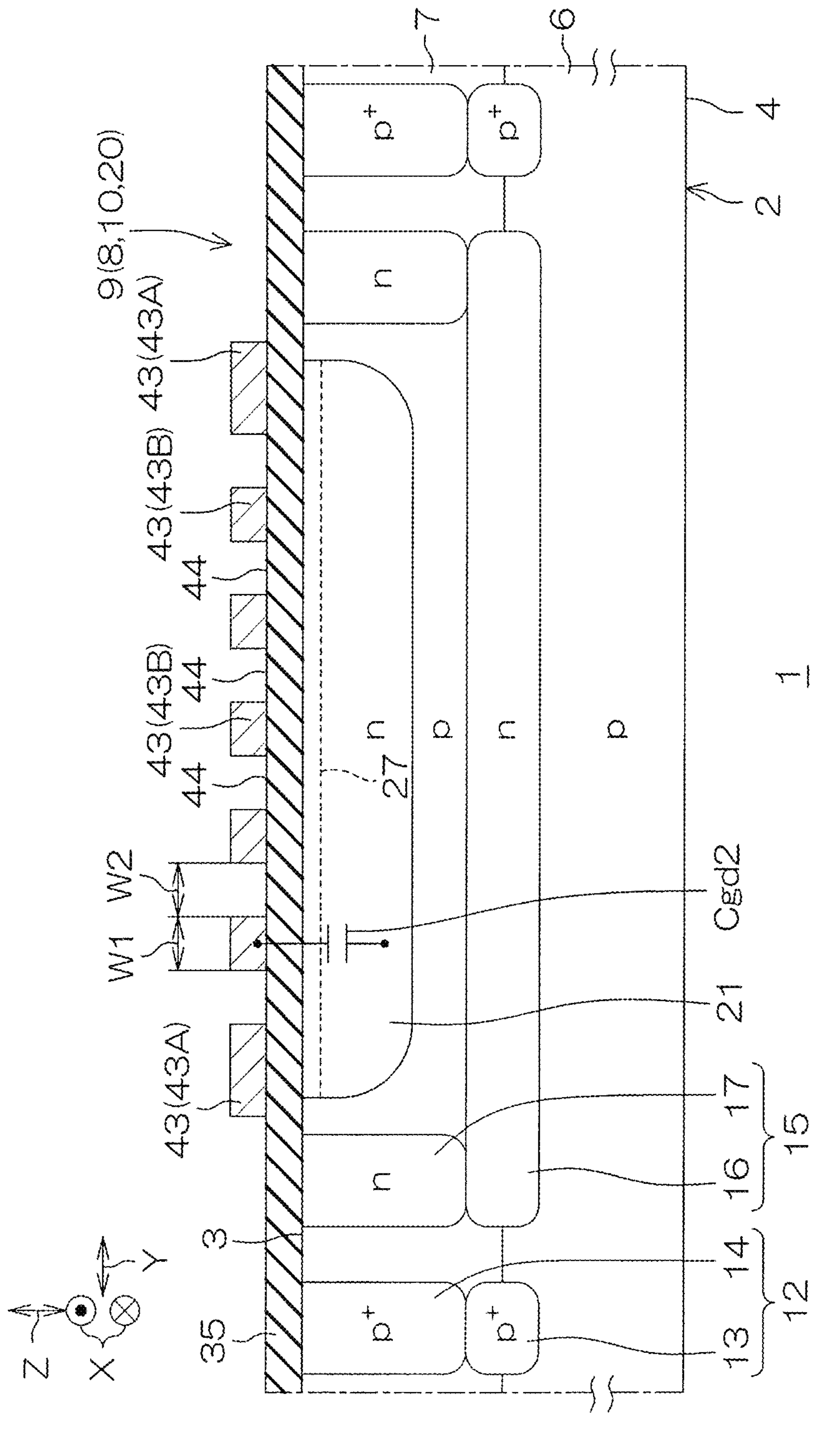
FIG. 6 is a cross-sectional view along line VI-VI shown in FIG. 2.

FIG. 2 is an enlarged view showing region II shown in FIG. 1 together with a gate electrode 40 according to a first mode example. FIG. 3 is a cross-sectional view along line III-III shown in FIG. 2. FIG. 4 is a cross-sectional view along line IV-IV shown in FIG. 2. FIG. 5 is a cross-sectional view along line V-V shown in FIG. 2. FIG. 6 is a cross-sectional view along line VI-VI shown in FIG.

Referring to FIG. 2 to FIG. 6, the semiconductor device 1 includes a region separation structure 11 that electrically separates the MISFET region 9 from other regions in the second semiconductor region 7. The region separation structure 11 is formed in an annular shape surrounding a part of the first main surface 3 in a plan view, and demarcates the MISFET region 9 having a predetermined shape. In this embodiment, the region separation structure 11 is formed in a quadrangular annular shape (in this embodiment, rectangular annular shape extending in the first direction X) in a plan view, and demarcates the MISFET region 9 having a quadrangular shape (in this embodiment, rectangular shape extending in the first direction X) by means of an inner peripheral edge. The planar shape of the region separation structure 11 (planar shape of the MISFET region 9) is arbitrary.

The region separation structure 11 includes a p-type first separation structure 12. A ground potential may be applied to the first separation structure 12. The first separation structure 12 is formed in an annular shape surrounding a part of the first main surface 3 in a plan view. The first separation structure 12 extends from the first main surface 3 toward the first semiconductor region 6 in the shape of a wall so as to cross the second semiconductor region 7, and is electrically connected to the first semiconductor region 6.

In this embodiment, the first separation structure 12 includes a p-type first embedded region 13 and a p-type first separation region 14. The first embedded region 13 is formed in a boundary portion between the first semiconductor region 6 and the second semiconductor region 7. The first embedded region 13 is formed at a distance from the first main surface 3 and from the second main surface 4 with respect to the normal direction Z, and is electrically connected to the first semiconductor region 6 and to the second semiconductor region 7. The first embedded region 13 has a p-type impurity concentration exceeding a p-type impurity concentration of the first semiconductor region 6. The p-type impurity concentration of the first embedded region 13 may be not less than $5\times10^{16}$ cm$^{-3}$ and not more than $5\times10^{18}$ cm$^{-3}$.

The first separation region 14 is formed in a region between the first main surface 3 and the first embedded region 13 in the second semiconductor region 7, and is electrically connected to the first embedded region 13. In this embodiment, the single first separation region 14 is formed, and yet the number of stacked layers of the first separation region 14 is arbitrary as long as the first separation region 14 is electrically connected to the first embedded region 13. The first separation regions 14 may be stacked from the first embedding region 13 side toward the first main surface 3 side. The p-type impurity concentration of the first separation region 14 may be not less than $1\times10^{17}$ cm$^{-3}$ and not more than $1\times10^{19}$ cm$^{-3}$. The first separation region 14 may have a p-type impurity concentration not more than the p-type impurity concentration of the first embedded region 13.

The region separation structure 11 includes an n-type (second conductivity type) second separation structure 15. A power potential may be applied to the second separation structure 15. The second separation structure 15 is formed at a distance inwardly from an inner peripheral edge of the first separation structure 12 in a plan view, and demarcates the MISFET region 9 in a region surrounded by the first separation structure 12. In detail, the second separation structure 15 is formed in a cylindrical shape that surrounds a part of the second semiconductor region 7 from the bottom side of the second semiconductor region 7 toward the first main surface 3 side. The second separation structure 15 fixes a part of the second semiconductor region 7 to an electrically floating state, and, at the same time, demarcates a part of this second semiconductor region 7 as the MISFET region 9.

In this embodiment, the second separation structure 15 includes an n-type second embedded region 16 and an n-type second separation region 17. The second embedded region 16 is formed in a boundary portion between the first semiconductor region 6 and the second semiconductor region 7 in a region surrounded by the first separation structure 12. The n-type impurity concentration of the second embedded region 16 may be not less than $5\times10^{17}$ cm$^{-3}$ and not more than $1\times10^{19}$ cm$^{-3}$.

The second embedded region 16 is formed at a distance inwardly from the inner peripheral edge of the first separation structure 12, and exposes a part of the first semiconductor region 6 between the first separation structure 12 and the second embedded region 16. The second embedded region 16 is formed at a distance from the first main surface 3 and the second main surface 4 with respect to the normal direction Z, and is electrically connected to the first semiconductor region 6 and to the second semiconductor region 7. In this embodiment, the second embedded region 16 is formed in a quadrangular shape (in detail, rectangular shape extending in the first direction X) along the inner peripheral edge of the first separation structure 12 in a plan view.

The second separation region 17 is formed in a region between the first main surface 3 and a peripheral edge portion of the second embedded region 16 in the second semiconductor region 7, and is electrically connected to the second embedded region 16. In this embodiment, the single second separation region 17 is formed, and yet the number of stacked layers of the second separation region 17 is arbitrary as long as the second separation region 17 is electrically connected to the second embedded region 16. The second separation regions 17 may be stacked from the peripheral edge portion side of the second embedded region 16 toward the first main surface 3 side. The n-type impurity concentration of the second separation region 17 may be not less than $1\times10^{17}$ cm$^{-3}$ and not more than $1\times10^{19}$ cm$^{-3}$.

The semiconductor device 1 includes the MISFET 10 formed in the MISFET region 9. The MISFET 10 includes at least one MISFET cell 20 formed in the MISFET region 9. If the MISFET 10 includes a plurality of MISFET cells 20, the MISFET cells 20 may be formed in the MISFET region 9 at a distance from each other in the first direction X. In this embodiment, the MISFET 10 is formed of the single MISFET cell 20. A detailed structure of the MISFET cell 20 will be hereinafter described.

The MISFET cell 20 includes an n-type drain-well region 21 formed in a surface layer portion of the second semiconductor region 7 in the MISFET region 9. The drain-well region 21 is formed on the end portion side of the MISFET region 9 (on the third side surface 5C side). The drain-well region 21 has an n-type impurity concentration exceeding the p-type impurity concentration of the second semiconductor region 7. The n-type impurity concentration of the drain-well region 21 may be not less than $1\times10^{16}$ cm$^{-3}$ and not more than $2\times10^{18}$ cm$^{-3}$.

The drain-well region 21 is formed at a distance from the second separation structure 15 (second separation region 17) toward the inward side of the MISFET region 9 in a plan view, and exposes a part of the second semiconductor region 7 in a peripheral edge portion of the MISFET region 9. In this embodiment, the drain-well region 21 is formed in a quadrangular shape along an inner peripheral edge (peripheral edge of the second embedded region 16) of the second separation structure 15 (second separation region 17) in a plan view. The drain-well region 21 is formed at a distance from the second embedded region 16 toward the first main surface 3 side with respect to the normal direction Z, and faces the second embedded region 16 across a part of the second semiconductor region 7. In other words, the drain-well region 21 has a side portion and a bottom portion that are electrically connected to the second semiconductor region 7.

The MISFET cell 20 includes a p-type source-well region 22 formed in the surface layer portion of the second semiconductor region 7 at a distance from the drain-well region 21 in the MISFET region 9. The source-well region 22 is formed on the other end portion side of the MISFET region 9 (on the fourth side surface 5D side) at a distance from the drain-well region 21 in the first direction X. The source-well region 22 has an n-type impurity concentration exceeding the p-type impurity concentration of the second semiconductor region 7. The p-type impurity concentration of the source-well region 22 may be not less than $5\times10^{16}$ cm$^{-3}$ and not more than $2\times10^{18}$ cm$^{-3}$.

The source-well region 22 is formed at a distance from the second separation structure 15 (second separation region 17) toward the inward side of the MISFET region 9 in a plan view, and exposes a part of the second semiconductor region 7 in the peripheral edge portion of the MISFET region 9. In this embodiment, the source-well region 22 is formed in a quadrangular shape along the inner peripheral edge (peripheral edge of the second embedded region 16) of the second separation structure 15 (second separation region 17) in a plan view. The source-well region 22 is formed at a distance from the second embedded region 16 toward the first main surface 3 side with respect to the normal direction Z, and faces the second embedded region 16 across a part of the second semiconductor region 7. In other words, the source-well region 22 has a side portion and a bottom portion that are electrically connected to the second semiconductor region 7.

The MISFET cell 20 includes an n-type drain region 23 formed in a surface layer portion of the drain-well region 21 in the MISFET region 9. The drain region 23 has an n-type impurity concentration exceeding the n-type impurity concentration of the drain-well region 21. The n-type impurity concentration of the drain region 23 may be not less than $1\times10^{19}$ cm$^{-3}$ and not more than $2\times10^{21}$ cm$^{-3}$.

The drain region 23 is formed at a distance inwardly from a peripheral edge of the drain-well region 21 in a plan view, and is formed in a belt shape extending in one direction (in the second direction Y). The planar shape of the drain region 23 is arbitrary, and may be formed in a square shape, a hexagonal shape, or a circular shape. The drain region 23 is formed at a distance from the bottom portion of the drain-well region 21 toward the first main surface 3 side with respect to the normal direction Z, and faces the second semiconductor region 7 across a part of the drain-well region 21.

The MISFET cell 20 includes an n-type source region 24 formed in a surface layer portion of the source-well region 22 in the MISFET region 9. The source region 24 is formed on the one end portion side of the source-well region 22 (the third side surface 5C side). The source region 24 has an n-type impurity concentration exceeding the n-type impurity concentration of the drain-well region 21. The n-type impurity concentration of the source region 24 may be not less than $1\times10^{19}$ $cm^{-3}$ and not more than $2\times10^{21}$ $cm^{-3}$. Preferably, the n-type impurity concentration of the source region 24 is substantially equal to the n-type impurity concentration of the drain region 23.

The source region 24 is formed at a distance inwardly from a peripheral edge of the source-well region 22 in a plan view, and is formed in a belt shape extending in one direction (in the second direction Y). The planar shape of the source region 24 is arbitrary, and may be formed in a square shape, a hexagonal shape, or a circular shape. The source region 24 is formed at a distance from the bottom portion of the source-well region 22 toward the first main surface 3 side with respect to the normal direction Z, and faces the second semiconductor region 7 across a part of the source-well region 22.

The MISFET cell 20 includes a p-type contact region 25 formed in the surface layer portion of the source-well region 22 in the MISFET region 9. The contact region 25 is formed on the other end portion side of the source-well region 22 (the fourth side surface 5D side). The contact region 25 has a p-type impurity concentration exceeding the p-type impurity concentration of the source-well region 22. The p-type impurity concentration of the contact region 25 may be not less than $5\times10^{18}$ $cm^{-3}$ and not more than $1\times10^{20}$ $cm^{-3}$.

The contact region 25 is formed at the surface layer portion of the source-well region 22 so as to be connected to the source region 24. The contact region 25 is formed at a distance inwardly from the peripheral edge of the source-well region 22 in a plan view, and is formed in a belt shape extending in one direction (in this embodiment, in the second direction Y). The planar shape of the contact region 25 is arbitrary, and may be formed in a square shape, a hexagonal shape, or a circular shape. The contact region 25 is formed at a distance from the bottom portion of the source-well region 22 toward the first main surface 3 side with respect to the normal direction Z, and faces the second semiconductor region 7 across a part of the source-well region 22.

The MISFET cell 20 includes a channel inversion region 26 (channel region) formed in a region between the drain region 23 and the source region 24 in the surface layer portion of the first main surface 3. In FIG. 3 and FIG. 4, the channel inversion region 26 is shown by a thick broken line. The channel inversion region 26 is a region in which a current passage and a current interruption are controlled in a current path formed between the drain region 23 and the source region 24. An electric current flowing between the drain region 23 and the source region 24 is a drain-source current.

The channel inversion region 26 is formed on the source region 24 side in a region between the drain region 23 and the source region 24. In detail, the channel inversion region 26 is formed in a region between the drain-well region 21 and the source region 24 in the surface layer portion of the first main surface 3. In more detail, the channel inversion region 26 is formed at the surface layer portion of the second semiconductor region 7 and at the surface layer portion of the source-well region 22 in the region between the drain-well region 21 and the source region 24. In this embodiment, the channel inversion region 26 is formed in a belt shape extending in the second direction Y in the whole area of an opposed region between the drain-well region 21 and the source region 24 in a plan view.

The MISFET cell 20 includes a drain-drift region 27 (drift region) formed in a region between the drain region 23 and the channel inversion region 26 in the surface layer portion of the first main surface 3. In FIG. 3 to FIG. 6, the drain-drift region 27 is shown by a thin broken line. The drain-drift region 27 is a region that serves as a current path between the drain region 23 and the source region 24 (channel inversion region 26). An electric current flowing between the drain region 23 and the source region 24 (channel inversion region 26) is a drain-source current.

The drain-drift region 27 is formed in the drain-well region 21. In detail, the drain-drift region 27 is formed in a region between the drain region 23 and the channel inversion region 26 in the drain-well region 21. In this embodiment, the drain-drift region 27 is formed in a belt shape extending in the second direction Y in the whole area of an opposed region between the drain region 23 and the channel inversion region 26 in a plan view. With respect to the first direction X, the length of the drain-drift region 27 may be not less than the length of the channel inversion region 26, or may be less than the length of the channel inversion region 26. The drain-well region 21 is included in the term "drain-drift region 27" in the following description.

The MISFET cell 20 includes a gate insulating film 30 formed on the first main surface 3 in the MISFET region 9. In this embodiment, the gate insulating film 30 includes silicon oxide. In detail, the gate insulating film 30 includes silicon oxide constituted of oxide of the semiconductor chip 2 (the second semiconductor region 7 and so on). The thickness of the gate insulating film 30 may be not less than 3 nm and not more than 100 nm.

The gate insulating film 30 covers a region between the drain region 23 and the source region 24 on the first main surface 3 in a film shape. In detail, the gate insulating film 30 is formed so as to straddle between the source region 24 and the drain-drift region 27 (drain-well region 21) on the first main surface 3, and covers the source region 24, the channel inversion region 26, and the drain-drift region 27.

The gate insulating film 30 includes a first portion 31 and a second portion 32. The first portion 31 covers a part of the second semiconductor region 7, a part of the source-well region 22, and a part of the source region 24 on the first main surface 3. In other words, the first portion 31 covers the channel inversion region 26 on the first main surface 3. Preferably, the first portion 31 covers the whole area of the channel inversion region 26. The first portion 31 is formed at a distance from the contact region 25 toward the drain region 23 side in a plan view, and exposes the source region 24 and the contact region 25. In this embodiment, the first portion 31 exposes a part of the source region 24 and the whole area of the contact region 25. The first portion 31 has a first length L1 with respect to the first direction X.

The second portion 32 is led out from the first portion 31 toward the drain region 23 side, and covers the drain-well region 21 on the first main surface 3. In other words, the second portion 32 covers the drain-drift region 27 on the first main surface 3. In detail, the second portion 32 is formed at a distance from the drain region 23 toward the source region 24 side in a plan view, and exposes a part of the drain-drift region 27 (in detail, an end portion on the fourth side surface 5D side) and the whole area of the drain region 23, and partially covers the drain-drift region 27.

The plane area of the second portion 32 may be not less than or less than the plane area of the part exposed from the second portion 32 in the drain-drift region 27. The second portion 32 has a second length L2 with respect to the first direction X. The second length L2 may be not less than the first length L1 or may be less than the first length L1.

The MISFET cell 20 includes a field insulating film 35 formed on the first main surface 3 in the MISFET region 9. In FIG. 2, an end portion (an opening portion) of the field insulating film 35 is shown by a thick broken line. The field insulating film 35 is formed inside and outside the MISFET region 9, and covers a region outside the gate insulating film 30 in the MISFET region 9. In this embodiment, the field insulating film 35 includes silicon oxide.

In detail, the field insulating film 35 includes silicon oxide constituted of oxide of the semiconductor chip 2 (second semiconductor region 7 and so on). The field insulating film 35 may be a LOCOS film (local oxidation of silicon film). The field insulating film 35 has a thickness differing from the thickness of the gate insulating film 30. In detail, the thickness of the field insulating film 35 exceeds the thickness of the gate insulating film 30. The thickness of the field insulating film 35 may be not less than 50 nm and not more than 500 nm.

The field insulating film 35 covers the second semiconductor region 7, the drain-well region 21, and the source-well region 22 in the MISFET region 9 so as to expose the drain region 23, the source region 24, and the contact region 25. The field insulating film 35 surrounds the gate insulating film 30 in a plan view, and is continuous with the first portion 31 and the second portion 32 of the gate insulating film 30. The field insulating film 35 covers the drain-drift region 27 in a region between the drain region 23 and the second portion 32 of the gate insulating film 30 and is continuous with the second portion 32.

In this embodiment, an example has been described in which the field insulating film 35 is formed structurally independent of the gate insulating film 30. However, the field insulating film 35 may be constituted of a part of the gate insulating film 30 (i.e., a thick film portion). Additionally, the field insulating film 35 may be constituted of a part of another gate insulating film that is thicker than the gate insulating film 30. Of course, the MISFET cell 20 may include an STI (Sallow Trench Isolation) structure instead of the field insulating film 35. The STI structure includes a trench formed in the first main surface 3 and an insulator embedded in the trench. The insulator may include at least either one of silicon oxide and silicon nitride.

The MISFET cell 20 includes the gate electrode 40 formed on the gate insulating film 30. In FIG. 2, the gate electrode 40 is shown by hatching. The gate electrode 40 forms a planar gate structure together with the gate insulating film 30. In this embodiment, the gate electrode includes conductive polysilicon. The conductive polysilicon includes at least either one of n-type polysilicon and p-type polysilicon.

The gate electrode 40 covers a region between the drain region 23 and the source region 24 on the gate insulating film 30 in a film shape. In detail, the gate electrode 40 is formed so as to straddle between the source region 24 and the drain-drift region 27 (drain-well region 21) on the gate insulating film 30, and covers the drain-drift region 27, the channel inversion region 26, and the source region 24 across the gate insulating film 30. The gate electrode 40 has a planar shape differing from the planar shape of the gate insulating film 30.

In detail, the gate electrode 40 includes a first electrode portion 41 and a second electrode portion 42 that are formed in mutually different planar shapes in mutually different regions on the gate insulating film 30. The first electrode portion 41 is formed on the first portion 31 of the gate insulating film 30, and faces a part of the second semiconductor region 7, a part of the source-well region 22, and a part of the source region 24 across the first portion 31 of the gate insulating film 30. In other words, the first electrode portion 41 faces the channel inversion region 26 across the first portion 31.

Preferably, the first electrode portion 41 faces the whole area of the channel inversion region 26 across the first portion 31. Preferably, the gate electrode 40 (first electrode portion 41) crosses a peripheral edge of the channel inversion region 26 in the second direction Y in a plan view, and is led out to a region (on the field insulating film 35) outside the channel inversion region 26. A part, which has been led out in the second direction Y so as to reach the region outside the channel inversion region 26, of the gate electrode 40 may be formed as a connection portion of a gate contact electrode (not shown). The first electrode portion 41 is formed at a distance from the contact region 25 to the source region 24 side in a plan view, and exposes the source region 24 and the contact region 25.

The second electrode portion 42 is formed on the second portion 32 of the gate insulating film 30. In detail, the second electrode portion 42 is led out from the first electrode portion 41 onto the second portion 32 so as to partially expose the second portion 32, and faces a part of the drain-drift region 27 across the second portion 32. Additionally, the second electrode portion 42 is led out from on the second portion 32 onto the field insulating film 35 so as to partially expose the field insulating film 35, and faces the drain-drift region 27 across the field insulating film 35.

The second electrode portion 42 forms a gate-drain capacitance Cgd between the second electrode portion 42 and the drain-drift region 27. The gate-drain capacitance Cgd is also referred to as feedback capacitance Crss. The gate-drain capacitance Cgd includes a first gate-drain capacitance Cgd1 and a second gate-drain capacitance Cgd2 connected in parallel with the first gate-drain capacitance Cgd1.

The first gate-drain capacitance Cgd1 is formed at a part, which faces the drain-drift region 27 across the gate insulating film 30, of the second electrode portion 42. The second gate-drain capacitance Cgd2 is formed at a part, which faces the drain-drift region 27 across the field insulating film 35, of the second electrode portion 42. The gate-drain capacitance Cgd includes a composite capacitance of the first gate-drain capacitance Cgd1 and the second gate-drain capacitance Cgd2. The second gate-drain capacitance Cgd2 may be not more than the first gate-drain capacitance Cgd1, and may exceed the first gate-drain capacitance Cgd1.

The second electrode portion 42 has at least one lead-out portion 43 (in this embodiment, a plurality of lead-out portions 43) led out from the first electrode portion 41 onto the second portion 32 so as to partially expose the second portion 32. The number of the lead-out portions 43 is appropriately adjusted in accordance with the length in the second direction Y of the gate electrode 40 (the gate insulating film 30).

The lead-out portions 43 are each led out in a belt shape from the first electrode portion 41 toward the drain region 23 side onto the second portion 32 in a plan view, and are arranged at a distance from each other in the second direction Y. In other words, the second electrode portion 42 (lead-out portions 43) is led out in a comb-teeth shape from the first electrode portion 41 toward the drain region 23 side in a plan view. Additionally, the second electrode portion 42 (lead-out portions 43) covers a plurality of parts of the second portion 32 at a distance from each other in a line in the second direction Y in a plan view. Preferably, the lead-out portions 43 are equally spaced out in the second direction Y.

Each of the lead-out portions 43 covers the second portion 32 at a distance from the first portion 31 (channel inversion region 26) toward the drain region 23 side in a plan view. In other words, the lead-out portions 43 cover only the second portion 32 with respect to the gate insulating film 30, and do not cover the first portion 31. Each of the lead-out portions 43 covers the second portion 32 at a distance from the drain region 23 toward the first portion 31 side (channel inversion region 26 side) in a plan view. The lead-out portions 43 face the drain region 23 on one side in the first direction X in a plan view, and face the source region 24 (channel inversion region 26) on the other side in the first direction X.

In this embodiment, the lead-out portions 43 include two outer lead-out portions 43A disposed at both ends in the second direction Y and a plurality of inner lead-out portions 43B interposed between the two outer lead-out portions 43A. The outer lead-out portion 43A may cross a peripheral edge of the drain-drift region 27 in the second direction Y in a plan view, and may be led out to a region (on the field insulating film 35) outside the drain-drift region 27.

In this case, the part, which has been led out to the region outside the channel inversion region 26, of the gate electrode 40 (the outer lead-out portion 43A) may be formed as a connection portion of the gate contact electrode (not shown). Of course, the outer lead-out portion 43A may be formed only in a region surrounded by the peripheral edge of the drain-well region 21 in a plan view.

In this embodiment, the inner lead-out portions 43B are formed only in the region surrounded by the peripheral edge of the drain-well region 21 in a plan view. Preferably, all of the inner lead-out portions 43B face the drain region 23 on one side in the first direction X in a plan view. Preferably, all of the inner lead-out portions 43B face the source region 24 (channel inversion region 26) on the other side in the first direction X in a plan view.

Additionally, the lead-out portions 43 are led out in a belt shape from on the second portion 32 of the gate insulating film 30 toward the drain region 23 side onto the field insulating film 35. In other words, each of the lead-out portions 43 continuously covers the second portion 32 and a part of the field insulating film 35. The lead-out portions 43 are formed at a distance from each other in the second direction Y on the field insulating film 35. In other words, the second electrode portion 42 (lead-out portions 43) covers a plurality of parts of the field insulating film 35 at a distance from each other in a line in the second direction Y in a plan view.

Preferably, each of the lead-out portions 43 (at least two or more inner lead-out portions 43B) has a first width W1 that is constant in the second direction Y. The first width W1 may be not less than 0.1 μm and not more than 5 μm. Of course, the lead-out portions 43 may have mutually-different first widths W1.

As thus described, the lead-out portions 43 face the drain-drift region 27 across the gate insulating film 30 (second portion 32), and face the drain-drift region 27 across the field insulating film 35. In other words, the lead-out portions 43 form the first gate-drain capacitance Cgd1 in a part covering the gate insulating film 30 (second portion 32), and form the second gate-drain capacitance Cgd2 in a part covering the field insulating film 35.

The second electrode portion 42 has at least one exposed portion 44 (in this embodiment, a plurality of exposed portions 44) demarcated by at least one lead-out portion 43 (in this embodiment, a plurality of lead-out portions 43). The exposed portion 44 is a portion in which the second electrode portion 42 (gate electrode 40) has been partially removed so as to partially expose the second portion 32, and may be referred to as a removed portion. The number of the exposed portions 44 is appropriately adjusted in accordance with the number of the lead-out portions 43 or in accordance with the length in the second direction Y of the gate electrode 40 (gate insulating film 30).

The exposed portions 44 are each demarcated between two adjoining lead-out portions 43. The exposed portions 44 are each demarcated by at least one side (in this embodiment, a plurality of sides) extending in a facing direction (first direction X) of the drain region 23 and the source region 24 on the second portion 32. In detail, the exposed portions 44 are each demarcated by at least two sides extending in directions intersecting each other in the second electrode portion 42. In this embodiment, the exposed portions 44 are each demarcated by a side extending in the second direction Y and by a side extending in the first direction X.

The sides extending in the first direction X are each formed by the lead-out portions 43. The sides extending in the second direction Y are each formed by base end portions of the lead-out portions 43. In other words, the exposed portions 44 are each demarcated by the sides of the lead-out portions 43. The term “side” mentioned here is not necessarily required to linearly extend in a plan view, and may be curved.

The exposed portions 44 each extend in a belt shape from the second portion 32 toward the drain region 23 side in a plan view, and are arranged at a distance from each other in the second direction Y. In other words, in this embodiment, the exposed portions 44 are each formed of an open region (cutout portion) of the second electrode portion 42, and are each demarcated in a stripe shape extending in the first direction X as a whole in a plan view. Preferably, the exposed portions 44 are equally spaced out in the second direction Y.

When a line that connects the lead-out portions 43 in the second direction Y is set, the exposed portions 44 are positioned on this line. In other words, the exposed portions 44 are arranged at a distance from each other in the second direction Y alternately with the lead-out portions 43 in such a manner as to sandwich the single lead-out portion 43 between the exposed portions 44. Hence, the second electrode portion 42 (exposed portions 44) exposes a plurality of parts of the second portion 32 at a distance from each other in a line in the second direction Y in a plan view.

Each of the exposed portions 44 exposes the second portion 32 at a distance from the first portion 31 toward the drain region 23 side in a plan view. In other words, the exposed portions 44 expose only the second portion 32 with respect to the gate insulating film 30, and do not expose the first portion 31. Each of the exposed portions 44 exposes the second portion 32 at a distance from the drain region 23 toward the second portion 32 side in a plan view. Preferably, the exposed portions 44 are formed only in the region surrounded by the peripheral edge of the drain-well region 21 in a plan view.

The exposed portions 44 face the drain region 23 on one side in the first direction X, and face the source region 24 (channel inversion region 26) on the other side in the first direction X in a plan view. Preferably, all of the exposed portions 44 face the drain region 23 on one side in the first direction X in a plan view. Preferably, all of the exposed portions 44 face the source region 24 (channel inversion region 26) on the other side in the first direction X in a plan view.

Additionally, each of the exposed portions 44 partially exposes a part of the field insulating film 35 in a region between the lead-out portions 43. In other words, each of the exposed portions 44 continuously exposes the second portion 32 of the gate insulating film 30 and a part of the field insulating film 35. In this case, the exposed portions 44 are each demarcated by at least one side (in this embodiment, a plurality of sides) extending in a facing direction (first direction X) of the drain region 23 and the source region 24 on the field insulating film 35. The facing direction (first direction X) is a direction in which a drain-source current flows. The sides extending in the facing direction are each formed by the lead-out portions 43. The term "side" mentioned here is not necessarily required to linearly extend in a plan view, and may be curved.

The exposed portions 44 are each formed in a belt shape continuously extending in the first direction X from the second portion 32 toward the field insulating film 35, and are formed at a distance from each other in the second direction Y. When a line that connects the lead-out portions 43 in the second direction Y is set on the field insulating film 35, the exposed portions 44 are positioned on this line. In other words, the exposed portions 44 are also formed alternately with the lead-out portions 43 on the field insulating film 35 in such a manner as to sandwich the single lead-out portion 43 between the exposed portions 44 in the second direction Y. Additionally, the second electrode portion 42 (exposed portions 44) exposes a plurality of parts of the field insulating film 35 at a distance from each other in a line in the second direction Y in a plan view.

Preferably, the exposed portions 44 each have a second width W2 that is constant in the second direction Y. The second width W2 may be not less than 0.1 μm and not more than 5 μm. Of course, the exposed portions 44 may have mutually-different second widths W2. The second width W2 may be not less than the first width W1 (W1≤W2), or may be less than the first width W1 (W1>W2).

As thus described, the exposed portions 44 partially expose the gate insulating film 30 (second portion 32), and partially expose the field insulating film 35. In detail, the exposed portions 44 partially expose the gate insulating film 30 (second portion 32) and the field insulating film 35 in their parts adjacent to the lead-out portion 43 from the second direction Y. The exposed portions 44 reduce the first gate-drain capacitance Cgd1 in their parts that expose the gate insulating film 30 (second portion 32), and reduce the second gate-drain capacitance Cgd2 in their parts that expose the field insulating film 35.

The plane area (total plane area) of the exposed portions 44 may be not less than the plane area (total plane area) of the lead-out portions 43, or may be less than the plane area (total plane area) of the lead-out portions 43. The plane area (total plane area) of a part, which is placed at the field insulating film 35, of the exposed portions 44 may be not less than the plane area (total plane area) of a part, which is placed at the gate insulating film 30, of the exposed portions 44, or may be less than the plane area (total plane area) of a part, which is placed at the gate insulating film 30, of the exposed portions 44.

The lead-out portion 43 shields an electric field generated on the semiconductor chip 2 side, whereas the exposed portion 44 passes the electric field generated on the semiconductor chip 2 side. Hence, the electric field to be applied to the gate electrode 40 is thinned out, and the electric field with respect to the gate electrode 40 is relaxed. The shielding effect of the electric field with respect to the gate electrode 40 varies when the first width W1 of the lead-out portion 43 (second width W2 of the exposed portion 44) is increased or decreased. If the lead-out portion 43 identical in number (for example, the single lead-out portion 43) is taken as an assumptive example, the second width W2 of the exposed portion 44 is increased when the first width W1 of the lead-out portion 43 is decreased.

In this case, the first gate-drain capacitance Cgd1 and the second gate-drain capacitance Cgd2 are decreased. There is a possibility that the electric field that passes through the exposed portion 44 will be increased if the first width W1 is excessively decreased, and, as a result, the electric field will concentrate on the gate electrode 40 near the channel inversion region 26. Preferably, in consideration of the properties of the gate electrode 40, the first width W1 of each of the lead-out portions 43 is set at, at least, 0.5 μm (i.e., 0.5 μm or more). Additionally, preferably, the second width W2 of each of the exposed portions 44 is set at, at a maximum, 1 μm (i.e., 1 μm or less).

As thus described, the number, the planar shape, the first width W1, etc., of the lead-out portion 43 are appropriately adjusted in accordance with the electric field generated on the semiconductor chip 2 side. Additionally, the number, the planar shape, the second width W2, etc., of the exposed portion 44 are appropriately adjusted in accordance with the electric field generated on the semiconductor chip 2 side. The gate electrode 40 according to second to fifth mode examples will be hereinafter described with reference to FIG. 7A to FIG. 7E.

Figure 7A:
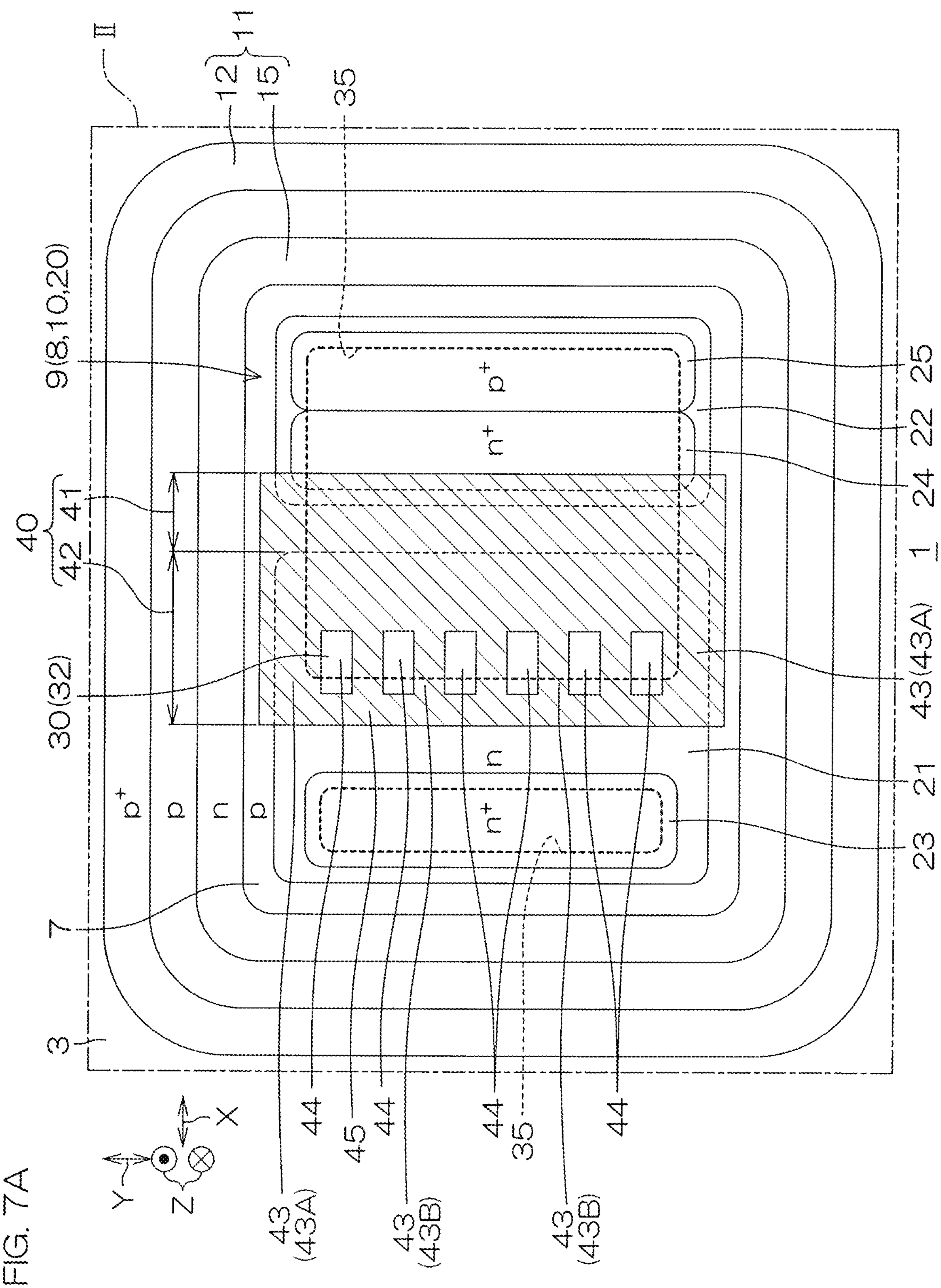
FIG. 7A is an enlarged view showing region II shown in FIG. 1 together with a gate electrode according to a second mode example.

FIG. 7A is an enlarged view showing region II shown in FIG. 1 together with the gate electrode 40 according to the second mode example. In FIG. 7A, the same reference sign is assigned to a constituent equivalent to each constituent shown in FIG. 1 to FIG. 6, and a description of this constituent is omitted.

Referring to FIG. 7A, the second portion 32 of the gate electrode 40 according to the second mode example includes an extension portion 45 that extends in the second direction Y on the field insulating film 35. The extension portion 45 is connected to the lead-out portions 43. Hence, the second portion 32 includes the exposed portions 44 demarcated by the lead-out portions 43 and by the extension portion 45 in a plan view. In this mode example, the exposed portions 44 are each formed of a closed region (opening) of the second electrode portion 42. In the gate electrode 40 according to the second mode example, the second electrode portion 42 formed in a latticed shape in a plan view can be regarded as being led out from the first electrode portion 41.

Figure 7B:
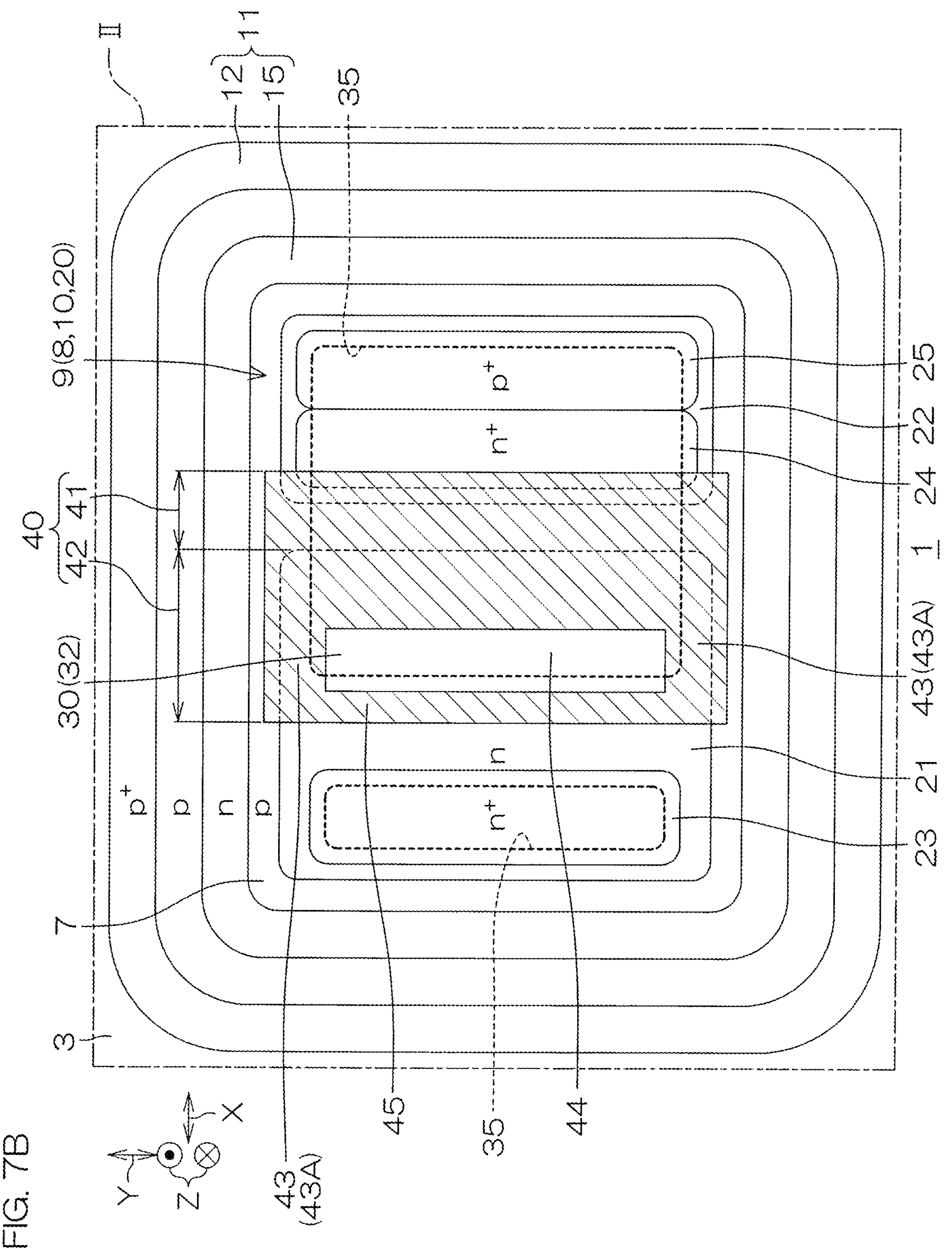
FIG. 7B is an enlarged view showing region II shown in FIG. 1 together with a gate electrode according to a third mode example.

FIG. 7B is an enlarged view showing region II shown in FIG. 1 together with the gate electrode 40 according to the third mode example. In FIG. 7B, the same reference sign is assigned to a constituent equivalent to each constituent shown in FIG. 1 to FIG. 6, and a description of this constituent is omitted.

Referring to FIG. 7B, the second portion 32 of the gate electrode 40 according to the third mode example includes two lead-out portions 43 and one extension portion 45. In this mode example, the outer lead-out portion 43A is formed as the two lead-out portions 43 as an example, and yet the two lead-out portions 43 may be the inner lead-out portion 43B. The two lead-out portions 43 are led out from both end portions in the second direction Y of the first portion 31 of the gate electrode 40 toward the drain region 23 side. The single extension portion 45 is formed in a belt shape extending in the second direction Y, and is connected to the two lead-out portions 43.

Hence, the second portion 32 includes one exposed portion 44 demarcated by the two lead-out portions 43 and by the single extension portion 45 in a plan view. In this mode example, the single exposed portion 44 is formed of a closed region (opening) of the second electrode portion 42, and is formed in a belt shape extending in the second direction Y. In the gate electrode 40 according to the third mode example, the second electrode portion 42 formed in an annular shape (in this mode example, a quadrangular annular shape) in a plan view can be regarded as being led out from the first electrode portion 41.

Figure 7C:
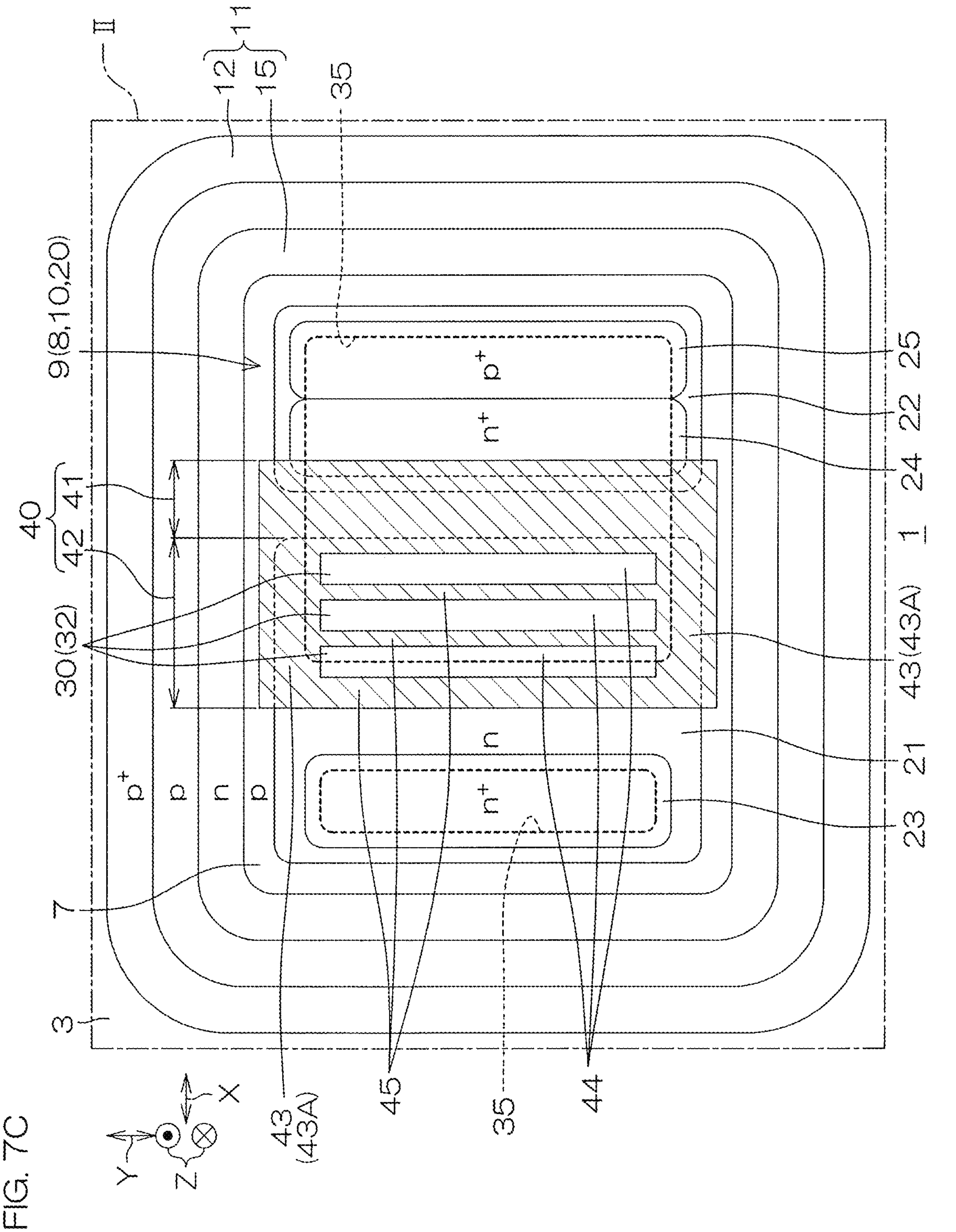
FIG. 7C is an enlarged view showing region II shown in FIG. 1 together with a gate electrode according to a fourth mode example.

FIG. 7C is an enlarged view showing region II shown in FIG. 1 together with the gate electrode 40 according to the fourth mode example. In FIG. 7C, the same reference sign is assigned to a constituent equivalent to each constituent shown in FIG. 1 to FIG. 6, and a description of this constituent is omitted.

Referring to FIG. 7C, the second portion 32 of the gate electrode 40 according to the fourth mode example includes two lead-out portions 43 and a plurality of extension portions 45. In this mode example, the outer lead-out portion 43A is formed as the two lead-out portions 43 as an example, and yet the two lead-out portions 43 may be the inner lead-out portion 43B. The two lead-out portions 43 are led out from both end portions in the second direction Y of the first portion 31 of the gate electrode 40 toward the drain region 23 side. The extension portions 45 are each formed in a belt shape extending in the second direction Y at a distance from each other in the first direction X, and are each connected to the two lead-out portions 43.

Hence, the second portion 32 includes the exposed portions 44 demarcated by the two lead-out portions 43 and by the extension portions 45 in a plan view. In this mode example, the exposed portions 44 are each formed of a closed region (opening) of the second electrode portion 42, and are each formed in a belt shape extending in the second direction Y at a distance from each other in the first direction X. In other words, the exposed portions 44 are formed in a stripe shape extending in the second direction Y in a plan view. At least one among the exposed portions 44 exposes at least the field insulating film 35. In the gate electrode 40 according to the fourth mode example, the second electrode portion 42 formed in a ladder shape in a plan view can be regarded as being led out from the first electrode portion 41.

Figure 7D:
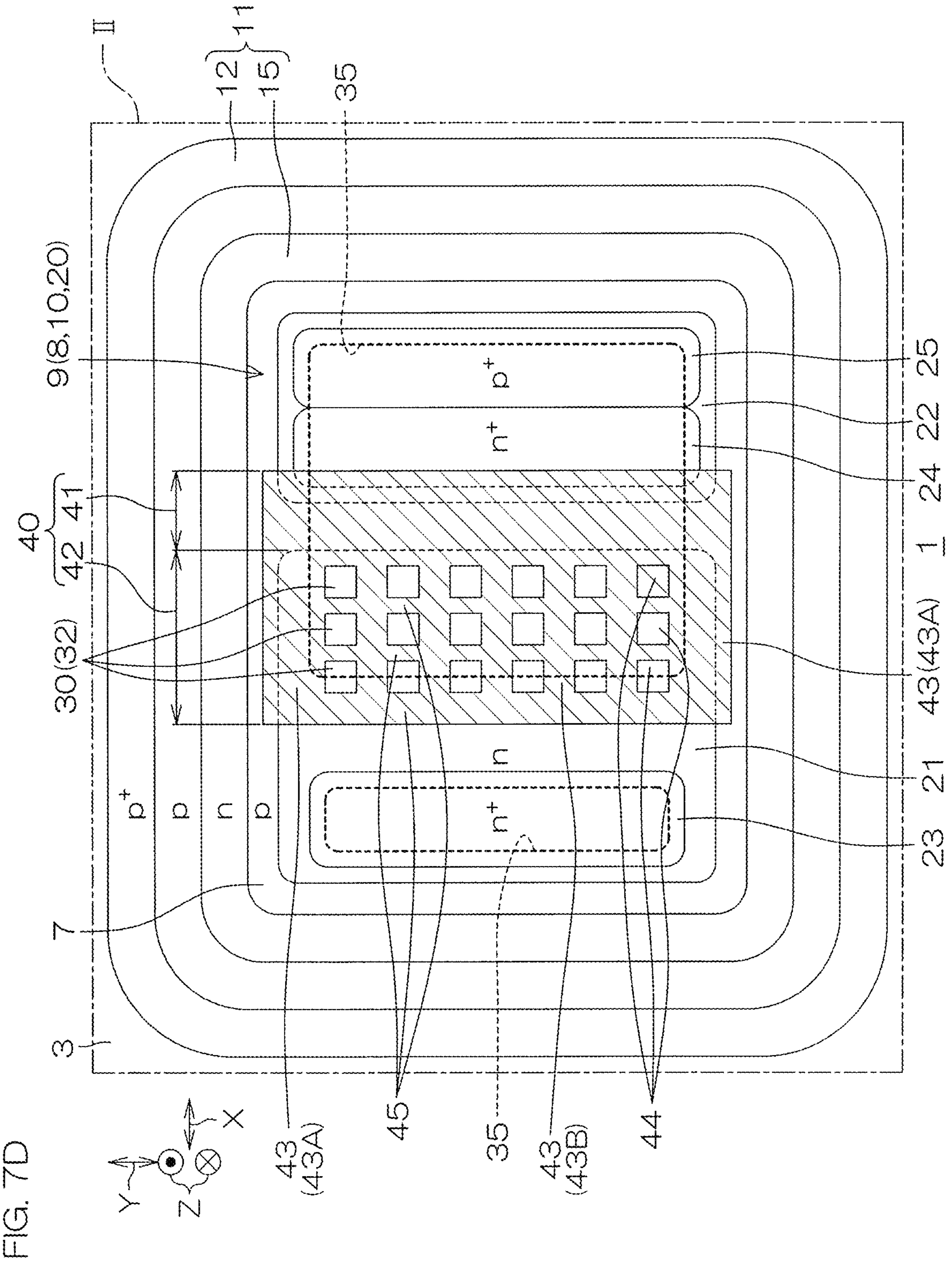
FIG. 7D is an enlarged view showing region II shown in FIG. 1 together with a gate electrode according to a fifth mode example.

FIG. 7D is an enlarged view showing region II shown in FIG. 1 together with the gate electrode 40 according to the fifth mode example. In FIG. 7D, the same reference sign is assigned to a constituent equivalent to each constituent shown in FIG. 1 to FIG. 6, and a description of this constituent is omitted.

Referring to FIG. 7D, the second portion 32 of the gate electrode 40 according to the fifth mode example includes a plurality of lead-out portions 43 and a plurality of extension portions 45. The lead-out portions 43 are led out from the first portion 31 of the gate electrode 40 toward the drain region 23 side in the same way as in the first mode example. The extension portions 45 are each formed in a belt shape extending in the second direction Y at a distance from each other in the first direction X, and are each connected to the lead-out portions 43.

Hence, the second portion 32 includes the exposed portions 44 demarcated by the lead-out portions 43 and by the extension portions 45 in a plan view. In this mode example, the exposed portions 44 are each formed of a closed region (opening) of the second electrode portion 42, and are arranged in a matrix manner at a distance from each other in the first direction X and in the second direction Y. At least one among the exposed portions 44 exposes at least the field insulating film 35. In the gate electrode 40 according to the fifth mode example, the second electrode portion 42 formed in a latticed shape having crossroads in a plan view can be regarded as being led out from the first electrode portion 41.

Figure 7E:
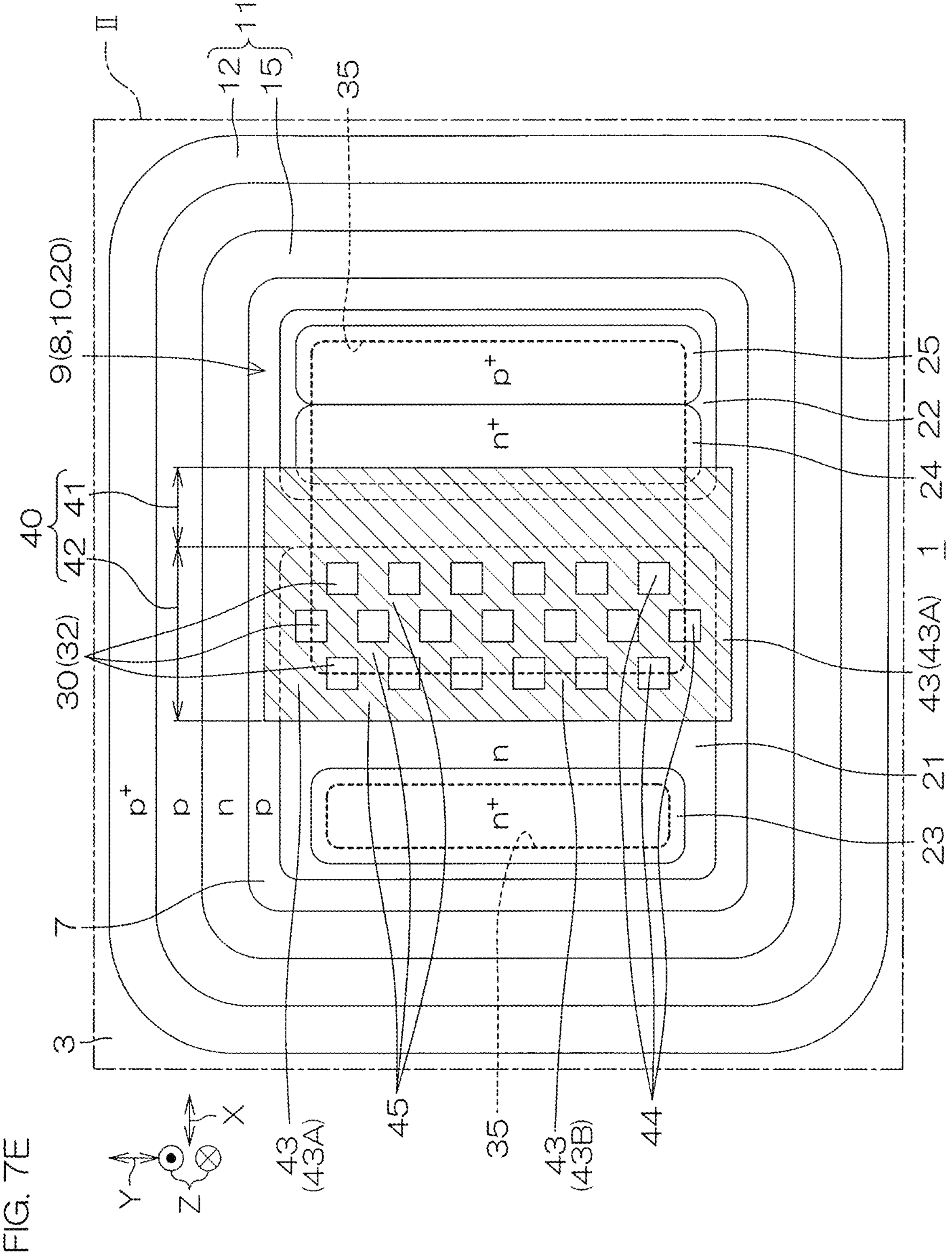
FIG. 7E is an enlarged view showing region II shown in FIG. 1 together with a gate electrode according to a sixth mode example.

FIG. 7E is an enlarged view showing region II shown in FIG. 1 together with the gate electrode 40 according to the sixth mode example. In FIG. 7E, the same reference sign is assigned to a constituent equivalent to each constituent shown in FIG. 1 to FIG. 6, and a description of this constituent is omitted.

Referring to FIG. 7E, the second portion 32 of the gate electrode 40 according to the sixth mode example includes the lead-out portions 43 and the extension portions 45. The lead-out portions 43 are each led out in a belt shape from the first portion 31 of the gate electrode 40 toward the drain region 23 side in a plan view. In this mode example, the lead-out portions 43 are formed in a meandering (zigzag) manner while being bent toward one side and opposite side in the second direction Y in a plan view.

The extension portions 45 are each formed in a belt shape extending in the second direction Y at a distance from each other in the first direction X, and are each connected to the lead-out portions 43. Hence, the second portion 32 includes the exposed portions 44 demarcated by the lead-out portions 43 and by the extension portions 45 in a plan view. In this mode example, the exposed portions 44 are each formed of a closed region (opening) of the second electrode portion 42, and are arranged in a staggered manner at a distance from each other in the first direction X and in the second direction Y. At least one among the exposed portions 44 exposes at least the field insulating film 35.

The gate electrode 40 according to the sixth mode example can be regarded as having a form in which the exposed portions 44 are arranged in a staggered manner at a distance in the first direction X and the second direction Y in the gate electrode 40 according to the fifth mode example. Additionally, in the gate electrode 40 according to the sixth mode example, the second electrode portion 42 formed in a latticed shape having T-shaped junctions in a plan view can be regarded as being led out from the first electrode portion 41.

Features of the gate electrode 40 according to the first to sixth mode examples can be combined in arbitrary modes thereamong. In other words, the semiconductor device 1 may have the gate electrode 40 that simultaneously includes at least two features among the features of the gate electrode 40 according to the first to sixth mode examples.

As described above, the semiconductor device 1 includes the semiconductor chip 2, the n-type drain region 23, the n-type source region 24, the channel inversion region 26, the drain-drift region 27, the gate insulating film 30, and the gate electrode 40. The semiconductor chip 2 has the first main surface 3. The drain region 23 is formed at the surface layer portion of the first main surface 3. The source region 24 is formed at the surface layer portion of the first main surface 3 at a distance from the drain region 23. The channel inversion region 26 is formed on the source region 24 side between the drain region 23 and the source region 24 in the surface layer portion of the first main surface 3. The drain-drift region 27 is formed in a region between the drain region 23 and the channel inversion region 26 in the surface layer portion of the first main surface 3.

The gate insulating film 30 includes the first portion 31 and the second portion 32. The first portion 31 covers the channel inversion region 26 on the first main surface 3. The second portion 32 covers the drain-drift region 27 on the first main surface 3. The gate electrode 40 includes the first electrode portion 41 and the second electrode portion 42. The first electrode portion 41 covers the first portion 31 of the gate insulating film 30. The second electrode portion 42 is led out onto the second portion 32 from the first electrode portion 41 so as to partially expose the second portion 32.

With this structure, the second electrode portion 42 forms the gate-drain capacitance Cgd between the drain-drift region 27 and the second electrode portion 42 in a part covering the second portion 32. The second electrode portion 42 partially exposes the second portion 32, and therefore this makes it possible to reduce the facing area of the second electrode portion 42 with respect to the drain-drift region 27. This makes it possible to reduce the gate-drain capacitance Cgd. As a result, it is possible to restrain the switching delay of the MISFET 10, hence making it possible to restrain the switching loss. Therefore, it is possible to provide the semiconductor device 1 that is capable of improving electrical properties.

Preferably, in this case, the second electrode portion 42 extends in the facing direction (first direction X) of the drain region 23 and the source region 24, and has a side that partially exposes the second portion 32. Preferably, the second electrode portion 42 has at least two sides that extend in directions intersecting each other and that partially expose the second portion 32 in a plan view. Preferably, the second electrode portion 42 has a side extending in one direction (first direction X) on the second portion 32 and a side extending in an intersection direction (second direction Y) that intersects the one direction in a plan view.

Preferably, the first electrode portion 41 covers the whole area of the first portion 31 in a plan view. This structure makes it possible to appropriately control the channel inversion region 26. Preferably, the second electrode portion 42 exposes the second portion 32 at a distance from the first portion 31 in a plan view. This structure makes it possible to appropriately control the channel inversion region 26. Preferably, the second electrode portion 42 exposes the second portion 32 only in a region surrounded by the peripheral edge of the drain-well region 21 in a plan view. This structure makes it possible to appropriately reduce the gate-drain capacitance Cgd. Particularly preferably, the second electrode portion 42 exposes only the second portion 32 in the gate insulating film 30.

Preferably, the first portion 31 covers the whole area of the channel inversion region 26 in a plan view, and the second portion 32 does not cover the whole area of the drain-drift region 27 in a plan view. In other words, preferably, the second portion 32 partially exposes the drain-drift region 27, and partially covers the drain-drift region 27. This structure makes it possible to appropriately control the channel inversion region 26, and makes it possible to appropriately reduce the gate-drain capacitance Cgd.

Preferably, the second electrode portion 42 exposes a plurality of parts of the second portion 32. This structure makes it possible to thin the electric field applied to the gate electrode 40 by means of the parts of the second portion 32. Hence, it is possible to relax electric field concentration with respect to the gate electrode 40 and to improve withstand voltage (for example, breakdown voltage). In this case, preferably, the second electrode portion 42 is regularly disposed in a plan view as shown in FIG. 2, and FIG. 7A to FIG. 7E. The second electrode portion 42 may expose the parts of the second portion 32 at a distance from each other in a line in either one of the first direction X and the second direction Y or in both of the first direction X and the second direction Y.

Preferably, the semiconductor device 1 includes the field insulating film 35. Preferably, the field insulating film 35 has a thickness differing from that of the gate insulating film 30. In this case, particularly preferably, the field insulating film 35 has a thickness exceeding the thickness of the gate insulating film 30. This structure makes it possible to obtain the effect of improving withstand voltage by means of the field insulating film 35. Preferably, the field insulating film 35 covers the drain-drift region 27 on the first main surface 3 so as to be continuous with, at least, the second portion 32. Particularly preferably, the field insulating film 35 is continuous with the first portion 31 and with the second portion 32.

Preferably, the second electrode portion 42 is led out onto the field insulating film 35 from on the second portion 32, and faces the drain-drift region 27 across the field insulating film 35. This structure makes it possible to reduce the gate-drain capacitance Cgd in a structure having the field insulating film 35. In this case, preferably, the second electrode portion 42 partially exposes the field insulating film 35.

The second electrode portion 42 forms the gate-drain capacitance Cgd between the drain-drift region 27 and the second electrode portion 42 in a part covering the field insulating film 35. With this structure, the second electrode portion 42 partially exposes the field insulating film 35, hence making it possible to reduce the facing area of the second electrode portion 42 with respect to the drain-drift region 27. This makes it possible to likewise reduce the gate-drain capacitance Cgd in the part, which covers the field insulating film 35, of the second electrode portion 42.

The second electrode portion 42 may be led out from on the second portion 32 onto the field insulating film 35 so as to continuously expose the field insulating film 35 from a part that partially exposes the second portion 32. Preferably, the second electrode portion 42 has a side that at least extends in the facing direction (first direction X) of the drain region 23 and the source region 24 in a plan view and that partially exposes the field insulating film 35.

Preferably, the second electrode portion 42 exposes a plurality of parts of the field insulating film 35. This structure makes it possible to thin the electric field applied to the gate electrode 40 by means of these parts of the field insulating film 35. This makes it possible to relax electric field concentration with respect to the gate electrode 40, and to improve withstand voltage (for example, breakdown voltage). In this case, preferably, the second electrode portion 42 is regularly disposed on the field insulating film 35 as shown in FIG. 2 and FIG. 7A to FIG. 7E in a plan view. The second electrode portion 42 may expose the parts of the field insulating film 35 at a distance from each other in a line in either one of the first direction X and the second direction Y or in both of the first direction X and the second direction Y.

In this embodiment, the semiconductor device 1 includes the p-type second semiconductor region 7 and the n-type drain-well region 21. The second semiconductor region 7 is formed at the surface layer portion of the first main surface 3. The drain-well region 21 is formed at the surface layer portion of the second semiconductor region 7. In this structure, the drain region 23 is formed at the surface layer portion of the drain-well region 21. The source region 24 is formed at the surface layer portion of the second semiconductor region 7 at a distance from the drain-well region 21. The channel inversion region 26 is formed in a region between the drain-well region 21 and the source region 24. The drain-drift region 27 is formed in the drain-well region 21.

The semiconductor device 1 may include the source-well region 22 formed at the surface layer portion of the second semiconductor region 7 at a distance from the drain-well region 21. In this case, the source region 24 may be formed at the surface layer portion of the source-well region 22. In this structure, the semiconductor device 1 may include the contact region 25 formed at the surface layer portion of the source-well region 22.

Figure 8:
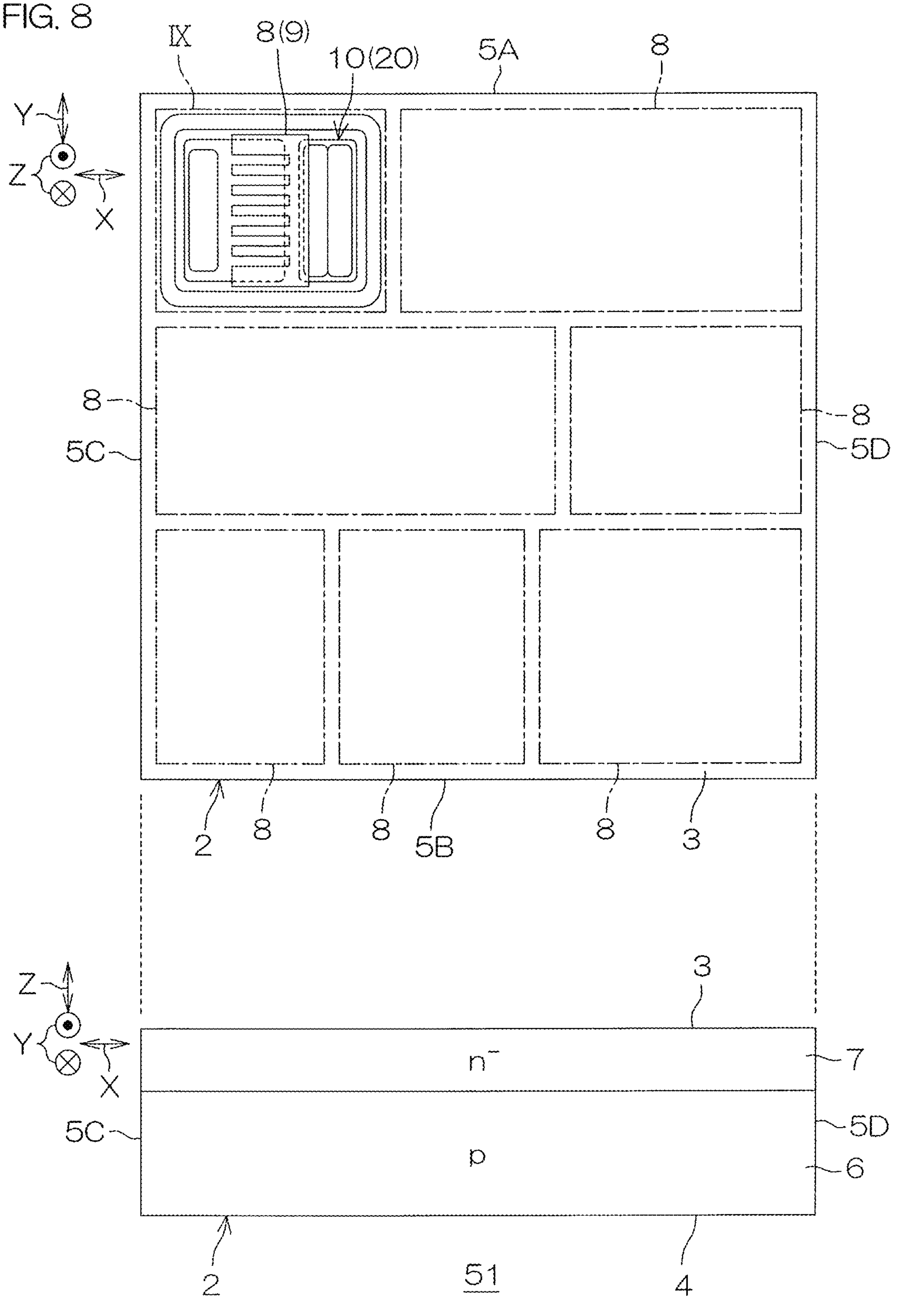
FIG. 8 is a schematic view showing a semiconductor device according to a second embodiment of the present invention.
Figure 9:
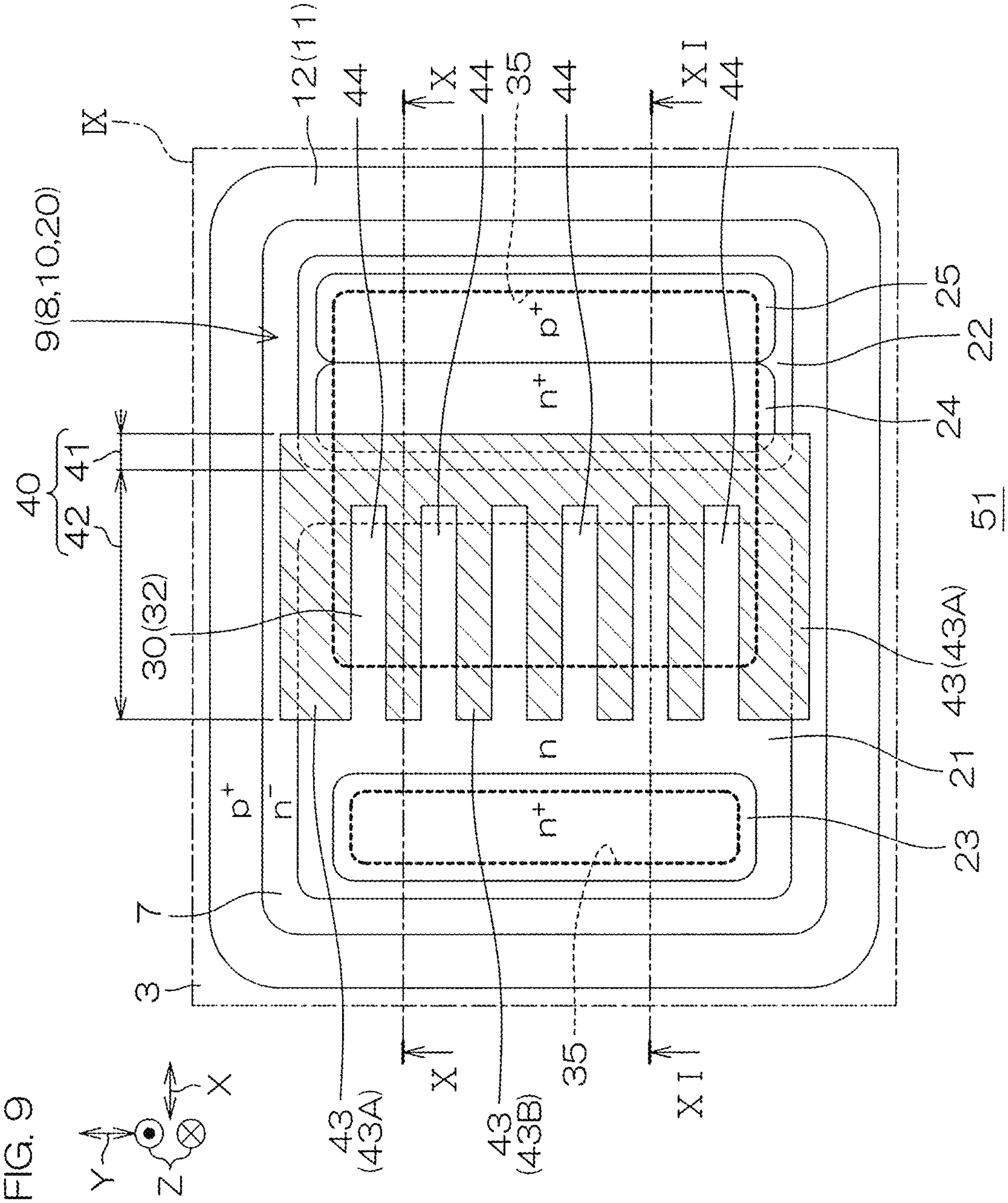
FIG. 9 is an enlarged view showing region IX shown in FIG. 8 together with the gate electrode according to the first mode example.
Figure 10:
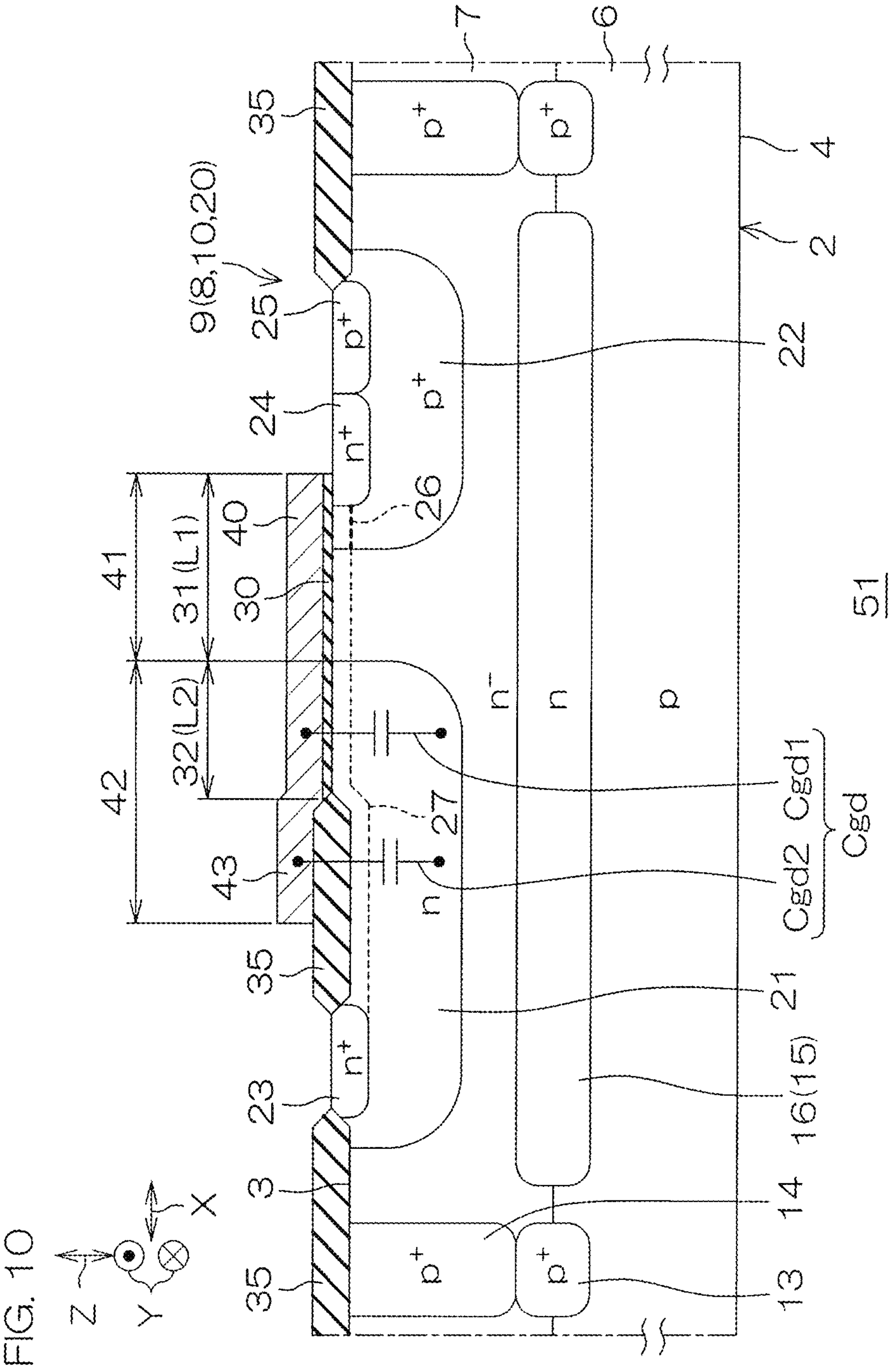
FIG. 10 is a cross-sectional view along line X-X shown in FIG. 9.
Figure 11:
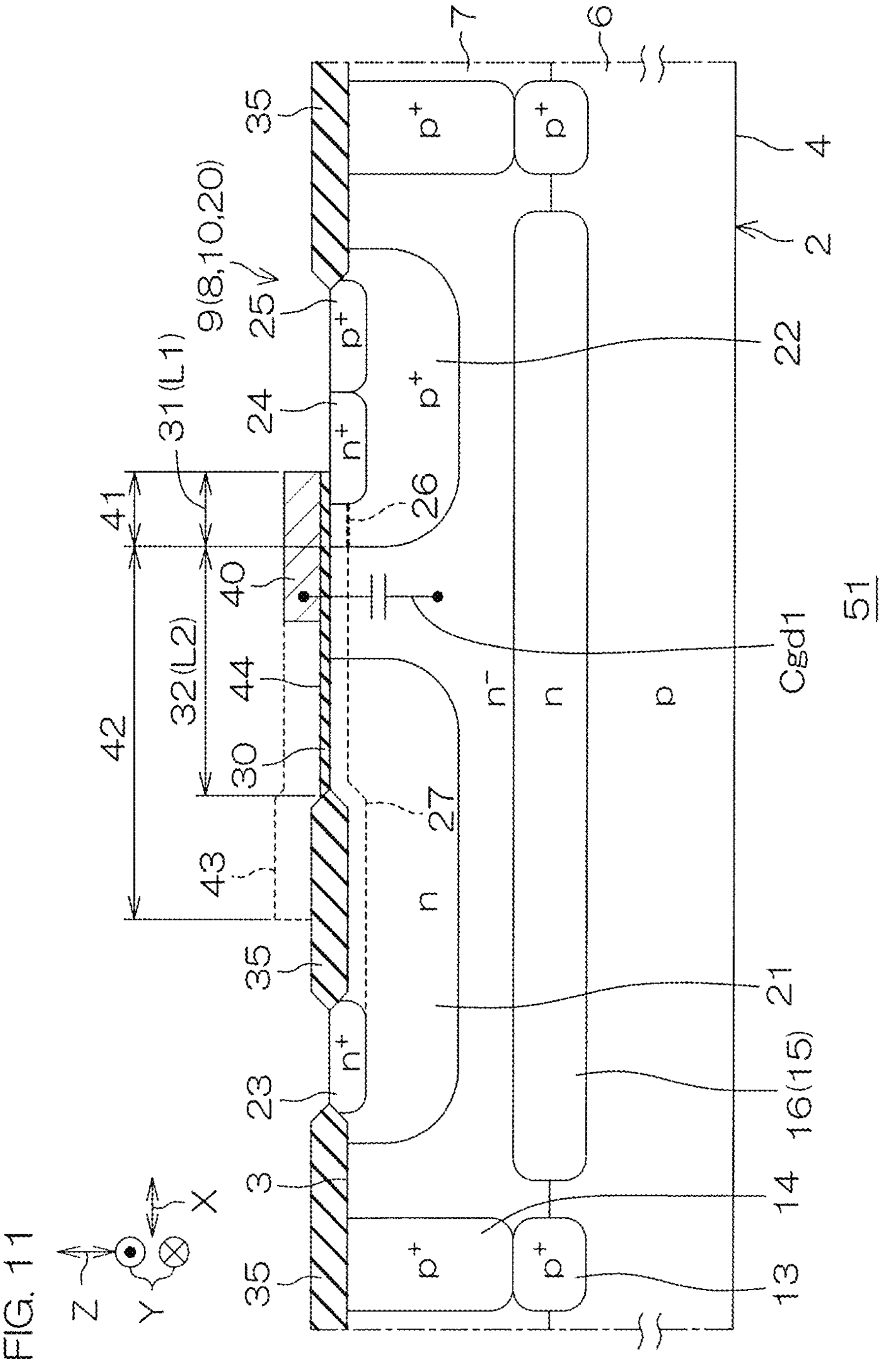
FIG. 11 is a cross-sectional view along line XI-XI shown in FIG. 9.

FIG. 8 is a schematic view showing a semiconductor device 51 according to a second embodiment of the present invention. FIG. 9 is an enlarged view showing region IX shown in FIG. 8 together with the gate electrode 40 according to the first mode example. FIG. 10 is a cross-sectional view along line X-X shown in FIG. 9. FIG. 11 is a cross-sectional view along line XI-XI shown in FIG. 9. Hereinafter, the same reference sign is assigned to a constituent equivalent to each constituent described with respect to the semiconductor device 1, and a description of this constituent is omitted.

Referring to FIG. 8 to FIG. 11, the semiconductor device 51 includes the semiconductor chip 2, the first semiconductor region 6, the second semiconductor region 7, the device regions 8, and the region separation structure 11 in the same way as the semiconductor device 1 according to the first embodiment. In this embodiment, the conductivity type of the second semiconductor region 7 has been changed from a p-type (first conductivity type) to an n-type (second conductivity type). The n-type impurity concentration of the second semiconductor region 7 may be not less than $5\times10^{14}$ $cm^{-3}$ and not more than $5\times10^{15}$ $cm^{-3}$. The thickness of the second semiconductor region 7 may be not less than 3 μm and not more than 15 μm. In this embodiment, the second semiconductor region 7 is formed of an n-type epitaxial layer.

The region separation structure 11 includes the p-type first separation structure 12 and the n-type second separation structure 15. In this embodiment, the second separation structure 15 includes the n-type second embedded region 16, and does not include the n-type second separation region 17.

The semiconductor device 51 includes the at least one MISFET cell 20 formed in the MISFET region 9 in the same way as the semiconductor device 1 according to the first embodiment. The MISFET cell 20 includes the drain-well region 21, the source-well region 22, the drain region 23, the source region 24, the contact region 25, the channel inversion region 26, and the drain-drift region 27. The drain-well region 21, the source-well region 22, the drain region 23, the source region 24, and the contact region 25 are each formed in the same manner as in the semiconductor device 1 according to the first embodiment.

The MISFET cell 20 includes the channel inversion region 26 formed in a region between the drain region 23 and the source region 24 in the surface layer portion of the first main surface 3. In FIG. 10 and FIG. 11, the channel inversion region 26 is shown by a thick broken line. The channel inversion region 26 is a region in which a current passage and a current interruption are controlled in a current path formed between the drain region 23 and the source region 24. An electric current flowing between the drain region 23 and the source region 24 is a drain-source current.

The channel inversion region 26 is formed on the source region 24 side in a region between the drain region 23 and the source region 24. In this embodiment, the channel inversion region 26 is formed between the second semiconductor region 7 and the source region 24 in the surface layer portion of the source-well region 22. In this embodiment, the channel inversion region 26 is formed in a belt shape extending in the second direction Y in the whole area between the peripheral edge of the source-well region 22 and the source region 24 in a plan view.

The MISFET cell 20 includes the drain-drift region 27 formed in a region between the drain region 23 and the channel inversion region 26 in the surface layer portion of the first main surface 3. In FIG. 10 and FIG. 11, the drain-drift region 27 is shown by a thin broken line. The drain-drift region 27 is a region in which the drain-drift region 27 serves as a current path between the drain region 23 and the source region 24. An electric current flowing between the drain region 23 and the source region 24 is a drain-source current.

In detail, the drain-drift region 27 is formed in a region between the source-well region 22 and the drain region 23. In other words, the drain-drift region 27 is formed in the second semiconductor region 7 and the drain-well region 21 both of which are placed in a region between the source-well region 22 and the drain region 23 in this embodiment. The drain-drift region 27 is formed in a belt shape extending in the second direction Y in the whole area of a facing region between the drain region 23 and the source-well region 22 in a plan view.

The MISFET cell 20 includes the gate insulating film 30, the field insulating film 35, and the gate electrode 40 that are formed on the first main surface 3 in the MISFET region 9 in the same way as in the semiconductor device 1 according to the first embodiment. In FIG. 9, an end portion of the field insulating film 35 is shown by a thick broken line, and the gate electrode 40 is shown by hatching. In this embodiment, an example is shown in which the MISFET cell 20 includes the gate electrode 40 according to the first mode example (see FIG. 2, etc., as well).

The gate insulating film 30 covers a region between the drain region 23 and the source region 24 in a film shape on the first main surface 3. In detail, the gate insulating film 30 is formed on the first main surface 3 so as to straddle between the source region 24 and the drain-drift region 27 (the drain-well region 21), and covers the second semiconductor region 7, the source region 24, the channel inversion region 26, and the drain-drift region 27.

In detail, the gate insulating film 30 includes the first portion 31 and the second portion 32. The first portion 31 covers a part of the source-well region 22 and a part of the source region 24 on the first main surface 3. In other words, the first portion 31 covers the channel inversion region 26 on the first main surface 3. Preferably, the first portion 31 covers the whole area of the channel inversion region 26. The first portion 31 is formed at a distance from the contact region 25 toward the source region 24 side in a plan view, and exposes a part of the source region 24 and the whole area of the contact region 25. The first portion 31 has the first length L1 with respect to the first direction X.

The second portion 32 is led out from the first portion 31 toward the drain region 23 side, and covers the second semiconductor region 7 and the drain-well region 21 on the first main surface 3. In other words, the second portion 32 covers the drain-drift region 27 on the first main surface 3. In detail, the second portion 32 is formed at a distance from the drain region 23 toward the source region 24 side in a plan view, and exposes a part (in detail, an end portion on the fourth side surface 5D side) of the drain-well region 21 and the whole area of the drain region 23, and partially covers the drain-drift region 27.

Preferably, the plane area of the second portion 32 is less than the plane area of a part, which is exposed from the second portion 32, of the drain-drift region 27. The second portion 32 has the second length L2 with respect to the first direction X. Preferably, the second length L2 exceeds the first length L1 (L1<L2).

In this embodiment, the gate electrode 40 is formed so as to straddle between the source region 24 and the drain-drift region 27 (drain-well region 21) on the gate insulating film 30, and covers the second semiconductor region 7, the drain-drift region 27, the channel inversion region 26, and the source region 24 across the gate insulating film 30. The gate electrode 40 has a planar shape differing from the planar shape of the gate insulating film 30.

The gate electrode 40 includes the first electrode portion 41 and the second electrode portion 42 that are formed in mutually-different planar shapes in mutually-different regions on the gate insulating film 30 in the same way as in the semiconductor device 1 according to the first embodiment. In this embodiment, the first electrode portion 41 is formed on the first portion 31 of the gate insulating film 30, and faces a part of the source-well region 22 and a part of the source region 24 across the first portion 31. In other words, the first electrode portion 41 faces the channel inversion region 26 across the first portion 31.

Preferably, the first electrode portion 41 faces the whole area of the channel inversion region 26 across the first portion 31. Preferably, the gate electrode 40 (first electrode portion 41) crosses the peripheral edge of the channel inversion region 26 in the second direction Y in a plan view, and is led out to a region outside the channel inversion region 26. The part, which has been led out to the region outside the channel inversion region 26, of the gate electrode 40 may be formed as the connection portion of the gate contact electrode (not shown). The first electrode portion 41 is formed at a distance from the contact region 25 toward the source region 24 side in a plan view, and exposes the source region 24 and the contact region 25.

The second electrode portion 42 is formed on the second portion 32 of the gate insulating film 30. In detail, the second electrode portion 42 is led out from the first electrode portion 41 onto the second portion 32 so as to partially expose the second portion 32, and faces a part of the drain-drift region 27 across the second portion 32. Additionally, the second electrode portion 42 is led out from on the second portion 32 onto the field insulating film 35, and faces the drain-drift region 27 across the field insulating film 35.

The second electrode portion 42 forms the gate-drain capacitance Cgd between the drain-drift region 27 and the second electrode portion 42. The gate-drain capacitance Cgd includes the first gate-drain capacitance Cgd1 and the second gate-drain capacitance Cgd2 connected in parallel with the first gate-drain capacitance Cgd1. In this embodiment, the first gate-drain capacitance Cgd1 is formed at a part, which faces the second semiconductor region 7 and the drain-well region 21 across the gate insulating film 30, of the second electrode portion 42. In this embodiment, the second gate-drain capacitance Cgd2 is formed at a part, which faces the drain-well region 21 across the field insulating film 35, of the second electrode portion 42.

The second electrode portion 42 has the at least one lead-out portion 43 (in this embodiment, a plurality of lead-out portions 43) led out from the first electrode portion 41 onto the second portion 32 so as to partially expose the second portion 32 between the first electrode portion 41 and the second electrode portion 42 in the same way as in the semiconductor device 1 according to the first embodiment. In this embodiment, the lead-out portions 43 is led out from a region between the drain-well region 21 and the source-well region 22 toward the drain region 23 side in a plan view. The lead-out portions 43 are led out from a position at a distance from the source-well region 22 toward the drain-well region 21 side.

In this embodiment, the lead-out portions 43 faces the second semiconductor region 7 and the drain-well region 21 across the gate insulating film 30 (second portion 32), and faces the second semiconductor region 7 and the drain-well region 21 across the field insulating film 35. In other words, the lead-out portions 43 form with the drain-drift region 27, the first gate-drain capacitance Cgd1 in a part covering the gate insulating film 30 (second portion 32). Additionally, the lead-out portions 43 form, with the drain-drift region 27, the second gate-drain capacitance Cgd2 in a part covering the field insulating film 35.

In this embodiment, an example has been described in which the lead-out portions 43 face the second semiconductor region 7 across the second portion 32. However, the lead-out portions 43 are not necessarily required to face the second semiconductor region 7. In other words, the lead-out portions 43 may be led out from a position at a distance from the second semiconductor region 7 toward the drain-well region 21 side, and may cover the drain-well region 21 across the second portion 32. In this case, the second electrode portion 42 may cover the whole area of a part, which covers the second semiconductor region 7, of the second portion 32.

The second electrode portion 42 has the at least one exposed portion 44 (in this embodiment, a plurality of exposed portions 44) demarcated by at least one lead-out portion 43 (in this embodiment, a plurality of lead-out portions 43) so as to partially expose the second portion 32 in the same way as in the semiconductor device 1 according to the first embodiment. In this embodiment, the exposed portions 44 extend from a region between the drain-well region 21 and the source-well region 22 toward the drain region 23 side in a plan view.

In this embodiment, the exposed portions 44 partially expose a part, which covers the second semiconductor region 7 and the drain-well region 21, of the second portion 32, and partially expose the field insulating film 35. In other words, the exposed portions 44 reduce the first gate-drain capacitance Cgd1 in their parts that expose the second semiconductor region 7 and the drain-well region 21, and reduce the second gate-drain capacitance Cgd2 in their parts that expose the field insulating film 35.

The semiconductor device 51 is enabled to fulfill the same effect as the effect described with respect to the semiconductor device 1 as described above. In this embodiment, an example has been described in which the semiconductor device 51 includes the gate electrode 40 according to the first mode example mentioned above. Of course, the semiconductor device 51 may include any one of the gate electrodes 40 according to the second to sixth mode examples instead of the gate electrode 40 according to the first mode example. Additionally, the semiconductor device 51 may have the gate electrode 40 that concurrently includes at least two among the features of the gate electrodes 40 according to the first to sixth mode examples mentioned above.

The present invention can be embodied in still other modes.

In the first embodiment mentioned above, a form in which the source-well region 22 and the contact region 25 are removed may be employed. In this case, the channel inversion region 26 is formed at the surface layer portion of the second semiconductor region 7 in a region between the drain-well region 21 and the source region 24.

In the second embodiment mentioned above, a form in which the drain-well region 21 is removed may be employed. In this case, the drain-drift region 27 is formed in the second semiconductor region 7. In other words, the second electrode portion 42 may form the first gate-drain capacitance Cgd1 in a part facing the second semiconductor region 7 across the gate insulating film 30, and may form the second gate-drain capacitance Cgd2 in a part facing the second semiconductor region 7 across the field insulating film 35.

In each of the aforementioned embodiments, an example has been described in which the first conductivity type is a p-type, and the second conductivity type is an n-type, and yet the first conductivity type may be an n-type, and the second conductivity type may be a p-type. A concrete configuration in this case can be obtained by replacing the n-type region with a p-type region and by replacing the p-type region with an n-type region in the foregoing description and in the accompanying drawings. In each of the aforementioned embodiments, an example has been described in which the p-type is expressed as the first conductivity type, and the n-type is expressed as the second conductivity type, and yet these are merely terms to clarify the order of the description, and the p-type may be expressed as the second conductivity type, and the n-type may be expressed as the first conductivity type.

Examples of features extracted from this description and from the drawings will be hereinafter shown. [A1] to [A20], [B1] to [B5], and [C1] to [C5] mentioned below provide semiconductor devices that are capable of improving electrical properties. In the following items, alphanumeric characters in parentheses represent corresponding components and so on in the aforementioned embodiments, and yet this does not mean that the scope of each item is limited to the embodiments.

[A1] A semiconductor device (1, 51) comprising: a chip (2) having a main surface (3); a drain region (23) formed at a surface layer portion of the main surface (3); a source region (24) formed at the surface layer portion of the main surface (3) at a distance from the drain region (23); a channel inversion region (26) formed on a side of the source region (24) between the drain region (23) and the source region (24) in the surface layer portion of the main surface (3); a drift region formed in a region between the drain region (23) and the channel inversion region (26) in the surface layer portion of the main surface (3); a gate insulating film (30) having a first portion (31) that covers the channel inversion region (26) on the main surface (3) and a second portion (32) that covers the drift region on the main surface (3); and a gate electrode (40) having a first electrode portion (41) covering the first portion (31) and a second electrode portion (42) led out from the first electrode portion (41) onto the second portion (32) so as to partially expose the second portion (32).

[A2] The semiconductor device (1, 51) according to A1, wherein the second electrode portion (42) has a side that extends in a facing direction (X) of the drain region (23) and the source region (24) and that partially exposes the second portion.

[A3] The semiconductor device (1, 51) according to A1 or A2, wherein the first electrode portion (41) covers a whole area of the first portion (31) in a plan view.

[A4] The semiconductor device (1, 51) according to any one of A1 to A3, wherein the second electrode portion (42) exposes the second portion (32) at a distance from the first portion (31) in a plan view.

[A5] The semiconductor device (1, 51) according to any one of A1 to A4, wherein the second electrode portion (42) exposes only the second portion (32) with respect to the gate insulating film (30).

[A6] The semiconductor device (1, 51) according to any one of A1 to A5, wherein the first portion (31) covers a whole area of the channel inversion region (26) in a plan view, and the second portion (32) partially covers the drift region so as to partially expose the drift region in a plan view.

[A7] The semiconductor device (1, 51) according to any one of A1 to A6, wherein the second electrode portion (42) exposes a plurality of parts of the second portion (32)

[A8] The semiconductor device (1, 51) according to any one of A1 to A7, wherein the second electrode portion (42) exposes the parts of the second portion (32) at a distance from each other in a line in a plan view.

[A9] The semiconductor device (1, 51) according to any one of A1 to A8, further comprising: a field insulating film (35) that covers the drift region on the main surface (3) and that has a thickness differing from a thickness of the gate insulating film (30).

[A10] The semiconductor device (1, 51) according to A9, wherein the field insulating film (35) is continuous with the second portion (32), and the second electrode portion (42) is led out from on the second portion (32) onto the field insulating film (35), and faces the drift region across the field insulating film (35).

[A11] The semiconductor device (1, 51) according to A10, wherein the second electrode portion (42) partially exposes the field insulating film (35).

[A12] The semiconductor device (1, 51) according to A11, wherein the second electrode portion (42) has a side that extends in a facing direction (X) of the drain region (23) and the source region (24) and that partially exposes the field insulating film (35).

[A13] The semiconductor device (1, 51) according to A11 or A12, wherein the second electrode portion (42) exposes a plurality of parts of the field insulating film (35).

[A14] The semiconductor device (1, 51) according to any one of A11 to A13, wherein the second electrode portion (42) exposes the parts of the field insulating film (35) in a line in a plan view.

[A15] The semiconductor device (1) according to any one of A1 to A14, further comprising: a first conductivity type (p-type) semiconductor region formed at a surface layer portion of the main surface (3); and a second conductivity type (n-type) drain-well region (21) formed at a surface layer portion of the semiconductor region; wherein the second conductivity type (n-type) drain region (23) is formed at a surface layer portion of the drain-well region (21), the second conductivity type (n-type) source region (24) is formed at the surface layer portion of the semiconductor region at a distance from the drain-well region (21), the channel inversion region (26) is formed in a region between the drain-well region (21) and the source region (24), and the drift region is formed in the drain-well region (21).

[A16] The semiconductor device (1) according to A15, further comprising: a first conductivity type (p-type) source-well region (22) formed at the surface layer portion of the semiconductor region at a distance from the drain-well region (21); wherein the source region (24) is formed at a surface layer portion of the source-well region (22).

[A17] The semiconductor device (1) according to A16, further comprising: a first conductivity type (p-type) contact region (25) formed at the surface layer portion of the source-well region (22).

[A18] The semiconductor device (51) according to any one of A1 to A14, further comprising: a first conductivity type (n-type) semiconductor region formed at the surface layer portion of the main surface (3); and a second conductivity type (p-type) source-well region (22) formed at the surface layer portion of the semiconductor region; wherein the first conductivity type (n-type) drain region (23) is formed at the surface layer portion of the semiconductor region at a distance from the source-well region (22), the first conductivity type (n-type) source region (24) is formed at the surface layer portion of the source-well region (22), the channel inversion region (26) is formed between the semiconductor region and the source region (24) in the surface layer portion of the source-well region (22), and the drift region is formed in a region between the source-well region (22) and the drain region (23).

[A19] The semiconductor device (51) according to A18, further comprising: a first conductivity type (n-type) drain-well region (21) formed at the surface layer portion of the semiconductor region at a distance from the source-well region (22); wherein the drain region (23) is formed at the surface layer portion of the drain-well region (21).

[A20] The semiconductor device (51) according to A18 or A19, further comprising: a second conductivity type (p-type) contact region (25) formed at the surface layer portion of the source-well region (22).

[B1] A semiconductor device (1) comprising: a chip (2) having a main surface (3); a first conductivity type (p-type) semiconductor region formed at a surface layer portion of the main surface (3); a second conductivity type (n-type) drain-well region (21) formed at a surface layer portion of the semiconductor region; a second conductivity type (n-type) drain region (23) formed at a surface layer portion of the drain-well region (21); a second conductivity type (n-type) source region (24) that is formed at the surface layer portion of the semiconductor region at a distance from the drain-well region (21) and that forms a channel inversion region (26) between the drain-well regions (21) and the source region (24) in the surface layer portion of the semiconductor region; a gate insulating film (30) having a first portion (31) that covers the channel inversion region (26) on the main surface (3) and a second portion (32) that covers the drain-well region (21) on the main surface (3); and a gate electrode (40) having a first electrode portion (41) that covers the first portion (31) and a second electrode portion (42) that is led out from the first electrode portion (41) onto the second portion (32) so as to partially expose the second portion (32).

[B2] The semiconductor device (1) according to B1, further comprising: a first conductivity type (p-type) source-well region (22) formed at the surface layer portion of the semiconductor region at a distance from the drain-well region (21); wherein the source region (24) is formed at a surface layer portion of the source-well region (22).

[B3] The semiconductor device (1) according to B2, further comprising: a first conductivity type (p-type) contact region (25) formed at the surface layer portion of the source-well region (22).

[B4] The semiconductor device (1) according to any one of B1 to B3, further comprising: a field insulating film (35) that covers the drain-well region (21) on the main surface (3) and that has a thickness differing from a thickness of the gate insulating film (30).

[B5] The semiconductor device (1) according to B4, wherein the field insulating film (35) is continuous with the second portion (32), and the second electrode portion (42) is led out from on the second portion (32) onto the field insulating film (35), and faces the drift region across the field insulating film (35).

[C1] A semiconductor device (51) comprising: a chip (2) having a main surface (3); a first conductivity type (n-type) semiconductor region formed at a surface layer portion of the main surface (3); a second conductivity type (p-type) source-well region (22) formed at a surface layer portion of the semiconductor region; a first conductivity type (n-type) drain region (23) formed at the surface layer portion of the semiconductor region at a distance from the source-well region (22); a first conductivity type (n-type) source region (24) that is formed at a surface layer portion of the source-well region (22) and that forms a channel inversion region (26) between the semiconductor region and the source region (24) in the surface layer portion of the source-well region (22); a gate insulating film (30) having a first portion (31) that covers the channel inversion region (26) on the main surface (3) and a second portion (32) that covers a region between the source-well region (22) and the drain region (23) on the main surface (3); and a gate electrode (40) having a first electrode portion (41) that covers the first portion (31) and a second electrode portion (42) that is led out from the first electrode portion (41) onto the second portion (32) so as to partially expose the second portion (32).

[C2] The semiconductor device (51) according to C1, further comprising: a first conductivity type (n-type) drain-well region (21) formed at the surface layer portion of the semiconductor region at a distance from the source-well region (22); wherein the drain region (23) is formed at a surface layer portion of the drain-well region (21).

[C3] The semiconductor device (51) according to C1 or C2, further comprising: a second conductivity type (p-type) contact region (25) formed at the surface layer portion of the source-well region (22).

[C4] The semiconductor device (51) according to any one of C1 to C3, further comprising: a field insulating film (35) that covers the drain-well region (21) on the main surface (3) and that has a thickness differing from a thickness of the gate insulating film (30).

[C5] The semiconductor device (51) according to C4, wherein the field insulating film (35) is continuous with the second portion (32), and the second electrode portion (42) is led out from on the second portion (32) onto the field insulating film (35), and faces the drift region across the field insulating film (35).

Although the embodiments of the present invention have been described in detail, these embodiments are merely concrete examples used to clarify the technical contents of the present invention, and the present invention should not be understood by being limited to these concrete examples, and the scope of the present invention is limited by the appended claims.

REFERENCE SIGNS LIST

1 semiconductor device
2 semiconductor chip
3 first main surface
21 drain-well region
22 source-well region
23 drain region
24 source region
25 contact region
26 channel inversion region
30 gate insulating film
31 first portion
32 second portion
35 field insulating film
40 gate electrode
41 first electrode portion
42 second electrode portion
51 semiconductor device

The invention claimed is:

1. A semiconductor device comprising:
a chip having a main surface;
a drain region formed at a surface layer portion of the main surface;
a source region formed at the surface layer portion of the main surface at a distance from the drain region;
a channel inversion region formed on a side of the source region between the drain region and the source region in the surface layer portion of the main surface;
a drift region formed in a region between the drain region and the channel inversion region in the surface layer portion of the main surface;
a gate insulating film having a first portion that covers the channel inversion region on the main surface and a second portion that covers the drift region on the main surface; and
a gate electrode having a first electrode portion covering the first portion and a second electrode portion led out from the first electrode portion onto the second portion so as to partially expose the second portion,
wherein the first electrode portion of the gate electrode overlaps a part of the source region, and
the second electrode portion of the gate electrode is led out in a comb-teeth shape from the first electrode portion toward the drain region side in a plan view.

2. The semiconductor device according to claim 1,
wherein the second electrode portion has a side that extends in a facing direction of the drain region and the source region and that partially exposes the second portion.

3. The semiconductor device according to claim 1,
wherein the first electrode portion covers a whole area of the first portion in the plan view.

4. The semiconductor device according to claim 1,
wherein the second electrode portion exposes the second portion at a distance from the first portion in the plan view.

5. The semiconductor device according to claim 1,
wherein the second electrode portion exposes only the second portion with respect to the gate insulating film.

6. The semiconductor device according to claim 1,
wherein the first portion covers a whole area of the channel inversion region in the plan view, and
the second portion partially covers the drift region so as to partially expose the drift region in the plan view.

7. The semiconductor device according to claim 1,
wherein the second electrode portion exposes a plurality of parts of the second portion.

8. The semiconductor device according to claim 1,
wherein the second electrode portion exposes the parts of the second portion at a distance from each other in a line in the plan view.

9. The semiconductor device according to claim 1, further comprising:
a field insulating film that covers the drift region on the main surface and that has a thickness differing from a thickness of the gate insulating film.

10. The semiconductor device according to claim 9,
wherein the field insulating film is continuous with the second portion, and
the second electrode portion is led out from on the second portion onto the field insulating film, and faces the drift region across the field insulating film.

11. The semiconductor device according to claim 10,
wherein the second electrode portion partially exposes the field insulating film.

12. The semiconductor device according to claim 11,
wherein the second electrode portion has a side that extends in a facing direction of the drain region and the source region and that partially exposes the field insulating film.

13. The semiconductor device according to claim 11,
wherein the second electrode portion exposes a plurality of parts of the field insulating film.

14. The semiconductor device according to claim 11,
wherein the second electrode portion exposes the parts of the field insulating film in a line in the plan view.

15. The semiconductor device according to claim 1, further comprising:
a semiconductor region of a first conductivity type formed at a surface layer portion of the main surface; and
a drain-well region of a second conductivity type formed at a surface layer portion of the semiconductor region;
wherein the drain region is of the second conductivity type and is formed at a surface layer portion of the drain-well region,
the source region is of the second conductivity type and is formed at the surface layer portion of the semiconductor region at a distance from the drain-well region,
the channel inversion region is formed in a region between the drain-well region and the source region, and
the drift region is formed in the drain-well region.

16. The semiconductor device according to claim 15, further comprising:
a source-well region of the first conductivity type formed at the surface layer portion of the semiconductor region at a distance from the drain-well region;
wherein the source region is formed at a surface layer portion of the source-well region.

17. The semiconductor device according to claim 16, further comprising:
a contact region of the first conductivity type formed at the surface layer portion of the source-well region.

18. The semiconductor device according to claim 1, further comprising:
a semiconductor region of a first conductivity type formed at the surface layer portion of the main surface; and a source-well region of a second conductivity type formed at the surface layer portion of the semiconductor region;

wherein the drain region is of the first conductivity type and is formed at the surface layer portion of the semiconductor region at a distance from the source-well region, the source region is of the first conductivity type and is formed at the surface layer portion of the source-well region, the channel inversion region is formed between the semiconductor region and the source region in the surface layer portion of the source-well region, and the drift region is formed in a region between the source-well region and the drain region.

19. The semiconductor device according to claim 18, further comprising:

a drain-well region of the first conductivity type formed at the surface layer portion of the semiconductor region at a distance from the source-well region;

wherein the drain region is formed at the surface layer portion of the drain-well region.

20. The semiconductor device according to claim 18, further comprising:

a contact region of the second conductivity type formed at the surface layer portion of the source-well region.

* * * * *